US012648288B2

(12) United States Patent
Bae et al.

(10) Patent No.: US 12,648,288 B2
(45) Date of Patent: Jun. 2, 2026

(54) DISPLAY DEVICE

(71) Applicant: SAMSUNG DISPLAY CO., LTD.,
Yongin-si (KR)

(72) Inventors: Kwang Soo Bae, Yongin-si (KR);
Gee-Bum Kim, Seoul (KR); **Bokwang
Song, Hwaseong-si (KR); Dae-Young
Lee, Seoul (KR); Min Oh Choi**,
Yongin-si (KR)

(73) Assignee: SAMSUNG DISPLAY CO., LTD.,
Yongin-si (KR)

( * ) Notice: Subject to any disclaimer, the term of this
patent is extended or adjusted under 35
U.S.C. 154(b) by 511 days.

(21) Appl. No.: 18/158,234

(22) Filed: Jan. 23, 2023

(65) Prior Publication Data

US 2023/0329019 A1     Oct. 12, 2023

(30) Foreign Application Priority Data

Apr. 6, 2022     (KR) ........................ 10-2022-0043093

(51) Int. Cl.
H10K 39/34         (2026.01)
G06F 3/044         (2006.01)
(Continued)

(52) U.S. Cl.
CPC ......... H10K 39/34 (2023.02); G06V 40/1318
(2022.01); G06V 40/1359 (2022.01);
(Continued)

(58) Field of Classification Search
CPC ................ G06F 3/044; G06V 40/1318; G06V
40/1359; G09G 2300/0426;
(Continued)

(56) References Cited

U.S. PATENT DOCUMENTS

| | | |
|---|---|---|
| 11,158,686 B2 | 10/2021 | Lee et al. |
| 2021/0064169 A1 | 3/2021 | Yazdanboost et al. |

(Continued)

FOREIGN PATENT DOCUMENTS

| | | |
|---|---|---|
| CN | 211787124 | 10/2020 |
| CN | 112882279 | 6/2021 |

(Continued)

*Primary Examiner* — Hong Zhou
(74) *Attorney, Agent, or Firm* — F. CHAU &
ASSOCIATES, LLC

(57)     ABSTRACT
A display device includes a display module and a window
disposed on the display module. The display module
includes a base layer, a light emitting element disposed on
the base layer, an optical sensing element disposed on the
base layer, a thin film encapsulation layer that covers the
light emitting element and the optical sensing element, an
insulating layer disposed on the thin film encapsulation
layer, a light blocking pattern disposed on the insulating
layer, and a color filter disposed on the insulating layer. The
insulating layer includes a first area that overlaps the light
emitting element and a second area that overlaps the optical
sensing element, and the second area has a thickness greater
than a thickness in the first area. The light blocking pattern
includes a first opening that corresponds to the light emitting
element and a second opening that corresponds to the optical
sensing element.

18 Claims, 15 Drawing Sheets

(51) Int. Cl.

| | |
|---|---|
| *G06V 40/12* | (2022.01) |
| *G06V 40/13* | (2022.01) |
| *G09G 3/3233* | (2016.01) |
| *H10K 59/122* | (2023.01) |
| *H10K 59/35* | (2023.01) |
| *H10K 59/38* | (2023.01) |
| *H10K 59/40* | (2023.01) |
| *H10K 59/80* | (2023.01) |

(52) U.S. Cl.

CPC ......... *H10K 59/122* (2023.02); *H10K 59/352* (2023.02); *H10K 59/353* (2023.02); *H10K 59/8792* (2023.02); *G06F 3/044* (2013.01); *G09G 3/3233* (2013.01); *G09G 2300/0819* (2013.01); *G09G 2300/0842* (2013.01); *G09G 2354/00* (2013.01); *H10K 59/38* (2023.02); *H10K 59/40* (2023.02)

(58) Field of Classification Search

CPC ... G09G 2300/0452; G09G 2300/0842; G09G 2354/00; G09G 2300/0819; G09G 3/3233; H10K 39/34; H10K 59/122; H10K 59/352; H10K 59/353; H10K 59/38; H10K 59/40; H10K 59/60; H10K 59/8792

See application file for complete search history.

(56) References Cited

U.S. PATENT DOCUMENTS

| | | | | |
|---|---|---|---|---|
| 2021/0167144 | A1 | 6/2021 | Lim et al. | |
| 2024/0074272 | A1* | 2/2024 | Kubota | H10K 59/876 |
| 2024/0196675 | A1* | 6/2024 | Kimura | H10K 50/11 |
| 2024/0260287 | A1* | 8/2024 | Kubota | H05B 33/22 |
| 2024/0389441 | A1* | 11/2024 | Kubota | H10K 59/126 |
| 2024/0407225 | A1* | 12/2024 | Kusunoki | H05B 33/04 |

FOREIGN PATENT DOCUMENTS

| | | |
|---|---|---|
| KR | 10-2019-0119697 A | 10/2019 |
| KR | 10-2020-0036255 A | 4/2020 |
| KR | 10-2021-0069776 | 6/2021 |

* cited by examiner

DISPLAY DEVICE

This U.S. non-provisional patent application claims priority under 35 U.S.C. § 119 from Korean Patent Application No. 10-2022-0043093, filed on Apr. 6, 2022 in the Korean Intellectual Property Office, the contents of which are herein incorporated by reference in their entirety.

TECHNICAL FIELD

Embodiments of the present disclosure are directed to a display device. More particularly, embodiments of the present disclosure are directed to a display device that recognizes biometric information.

DISCUSSION OF THE RELATED ART

Display devices provide a variety of functions to communicate organically with a user, such as displaying images to provide information to the user or sensing a user input. In recent years, display devices have been provided with various functions to sense biometric information of the user.

Biometric information recognition methods include a capacitance method that senses a variation in capacitance between electrodes, an optical method that senses incident light using an optical sensor, and an ultrasonic method that senses a vibration using a piezoelectric material, etc.

SUMMARY

Embodiments of the present disclosure provides a display device that includes a sensor with increased sensing performance for biometric information.

Embodiments of the inventive concept provide a display device that includes a display module and a window disposed on the display module. The display module includes a base layer, a light emitting element disposed on the base layer, an optical sensing element disposed on the base layer, a thin film encapsulation layer that covers the light emitting element and the optical sensing element, an insulating layer disposed on the thin film encapsulation layer, a light blocking pattern disposed on the insulating layer, and a color filter disposed on the insulating layer. The insulating layer includes a first area that overlaps the light emitting element and a second area that overlaps the optical sensing element, and the second area has a thickness greater than a thickness of the first area. The light blocking pattern includes a first opening that corresponds to the light emitting element and a second opening that corresponds to the optical sensing element.

A length (S1) of an effective fingerprint area is determined by the following Equation 1 of $$S1 = P + \frac{L1}{L2}(P + S2)$$

in a reference direction. P denotes a length in the reference direction of the second opening, S2 denotes a length in the reference direction of a sensing area of the optical sensing element, L1 denotes a distance in a thickness direction of the display device between an upper surface of the second area and an upper surface of the window, and L2 denotes a distance in a thickness direction of the display device between the upper surface of the second area and the optical sensing element.

The length (S1) of the effective fingerprint area is equal to or less than about 500 micrometers.

The length (P) of the second opening in the reference direction is within a range from about 6 micrometers to about 10 micrometers.

The optical sensing element includes a first electrode of which at least a portion is exposed without being covered by a pixel definition layer, a photoelectric conversion layer disposed on the first electrode, and a second electrode disposed on the photoelectric conversion layer. A length of a sensing area in the reference direction of the optical sensing element is a length in the reference direction of the portion of the first electrode exposed without being covered by the pixel definition layer.

The color filter overlaps the second opening.

The second area includes a slanted surface that extends upward from an upper surface of the first area and an upper surface that extends from the slanted surface and that corresponds to the upper surface of the optical sensing element.

The light emitting element includes first color light emitting elements, second color light emitting elements, and third light emitting elements. One first color light emitting element, two second color light emitting elements, and one third light emitting element form a unit light emitting element, and two optical sensing elements are disposed in the unit light emitting element.

The light emitting element includes first color light emitting elements, second color light emitting elements, and third light emitting elements. The optical sensing element is disposed at a center between the first light emitting element and the third light emitting element in a second direction and a center between two second light emitting elements in a first direction that crosses the second direction.

The two optical sensing elements are electrically connected to each other.

The display module further includes a pixel definition layer that includes a first opening formed therethrough that exposes a first electrode of the light emitting element and a second opening formed therethrough that exposes a first electrode of the optical sensing element. The first opening of the pixel definition layer is disposed inside the first opening of the light blocking pattern when viewed in a plan view, and the second opening of the light blocking pattern is disposed inside the second opening of the pixel definition layer when viewed in a plan view.

The display module further includes an overcoat layer disposed on the insulating layer and that covers the light blocking pattern and the color filter. The overcoat layer provides an upper surface that is flatter than an upper surface of the insulating layer.

The display module further includes at least one inorganic layer disposed between the thin film encapsulation layer and the insulating layer and a touch sensing electrode disposed between the thin film encapsulation layer and the insulating layer.

Embodiments of the inventive concept provide a display device that includes a display module and a window disposed on the display module. The display module includes a base layer, a light emitting element disposed on the base layer, an optical sensing element disposed on the base layer, a thin film encapsulation layer that covers the light emitting element and the optical sensing element, an insulating layer disposed on the thin film encapsulation layer, an insulating pattern disposed on the insulating layer, a light blocking pattern disposed on the insulating layer and the insulating pattern, and a color filter disposed on the insulating layer and the insulating pattern. The insulating pattern overlaps the optical sensing element. The light blocking pattern includes a first opening formed therethrough that corresponds to the light emitting element and a second opening formed therethrough that corresponds to the optical sensing element.

The insulating pattern has a thickness greater than a thickness of the insulating layer.

According to the above, the length of the effective fingerprint area is reduced by the insulating layer or the insulating pattern. As the length of the effective fingerprint area decreases to be equal to or less than a distance that corresponds to a pitch of a fingerprint, a resolution of the sensed fingerprint increases.

BRIEF DESCRIPTION OF THE DRAWINGS

FIGS. 8A and 8B are cross-sectional views of a display device according to an embodiment of the present disclosure.

Figure 11:
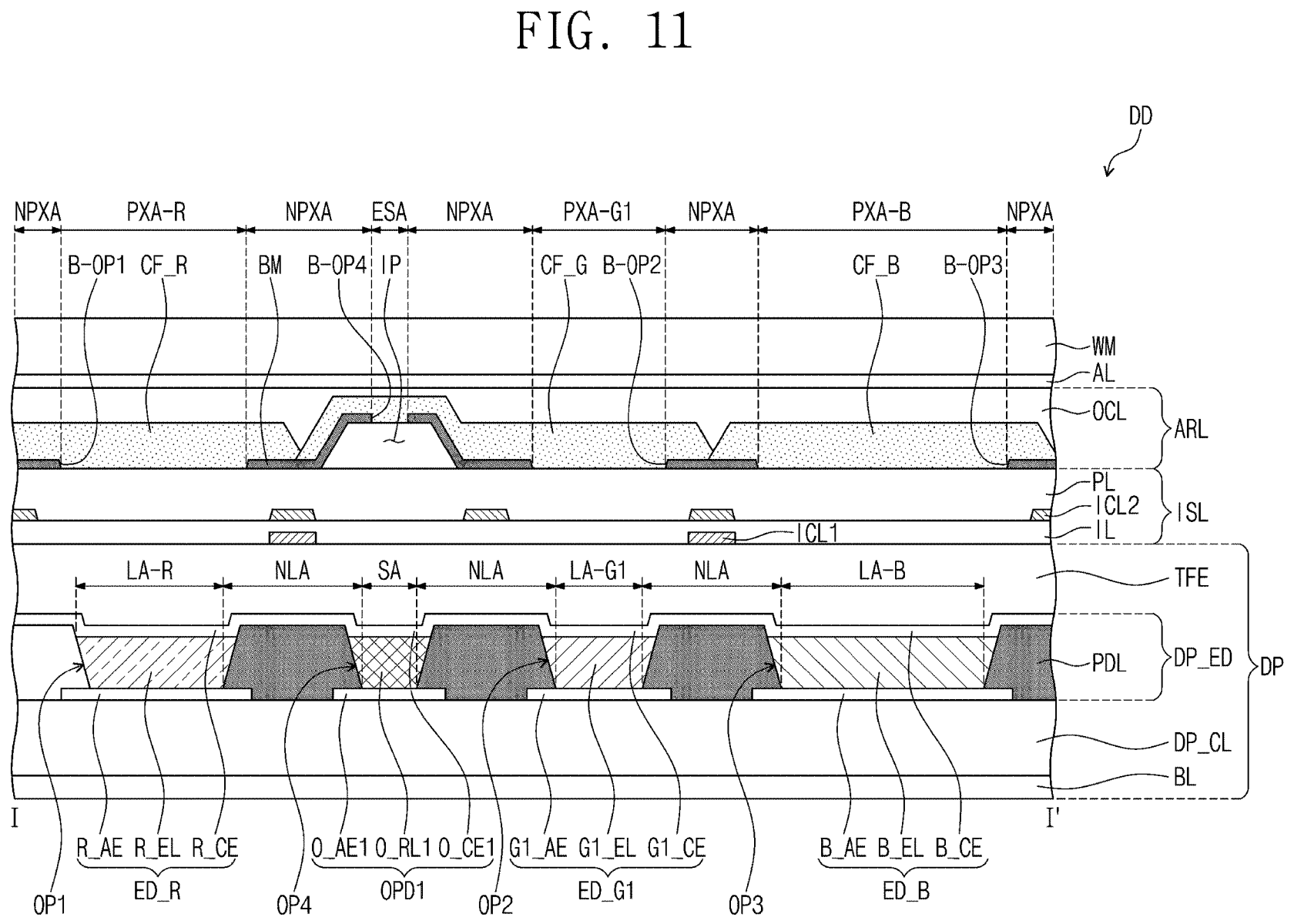

FIG. 11 is a cross-sectional view of a display device according to an embodiment of the present disclosure.

DETAILED DESCRIPTION

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals may refer to like elements throughout.

The term "about" as used herein is inclusive of the stated value and means within an acceptable range of deviation for the particular value as determined by one of ordinary skill in the art, considering the measurement in question and the error associated with measurement of the particular quantity, such as the limitations of the measurement system. For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Hereinafter, embodiments of the present disclosure will be described with reference to accompanying drawings.

Figure 1:
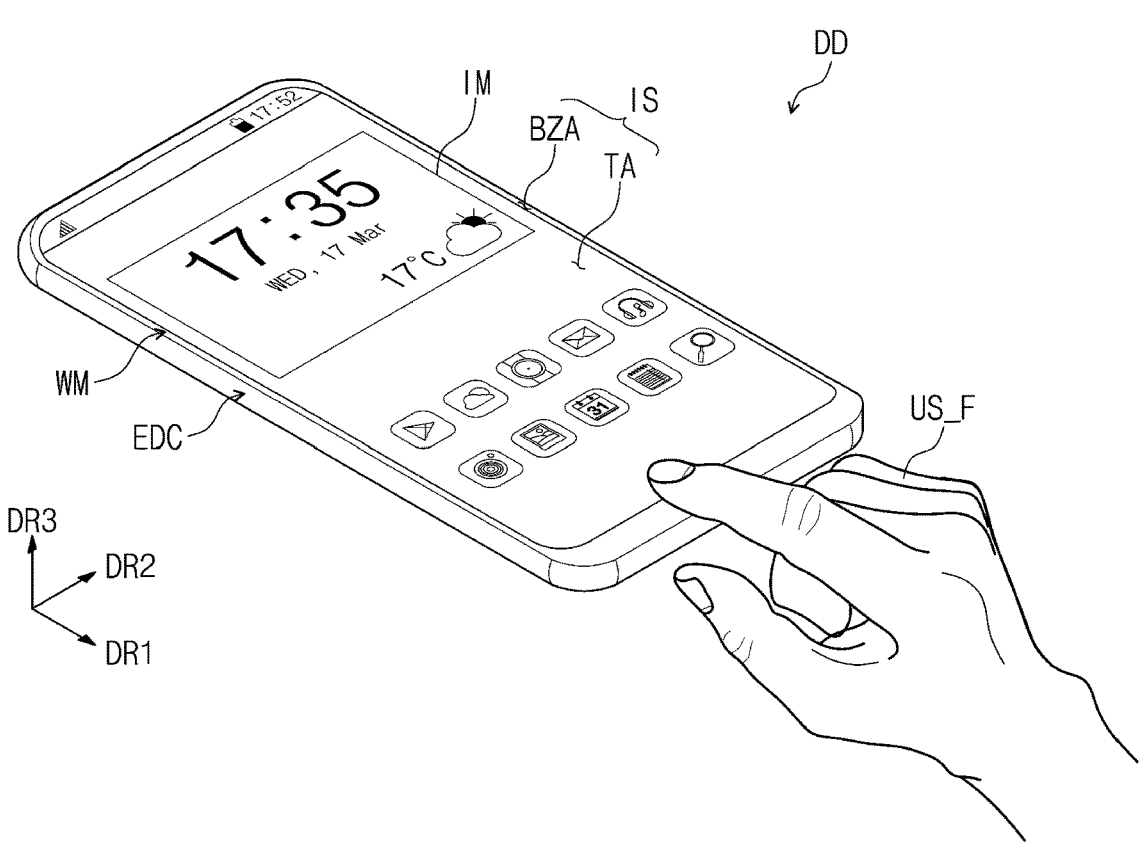
FIG. 1 is a perspective view of a display device according to an embodiment of the present disclosure.
Figure 2:
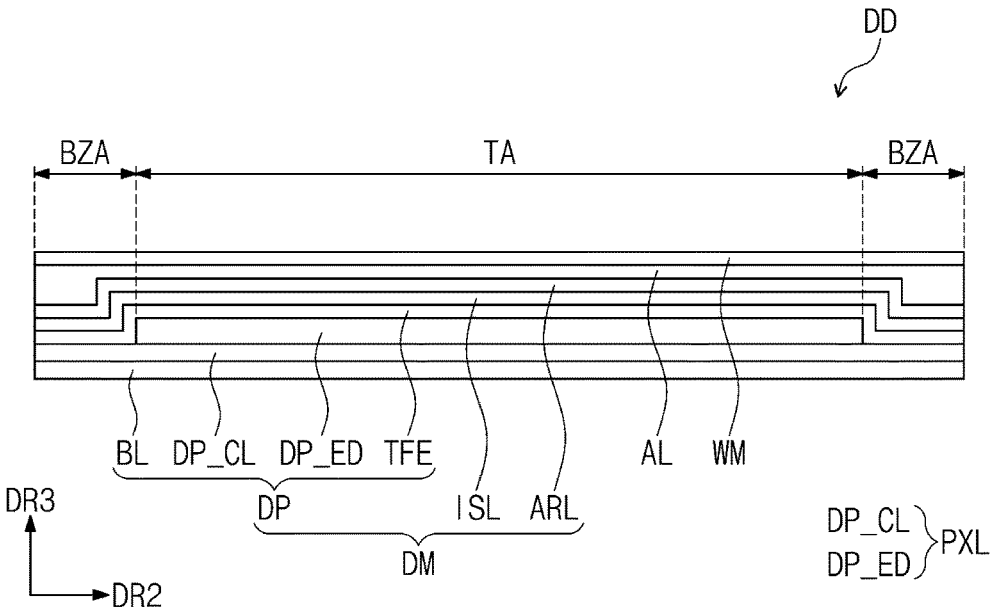
FIG. 2 is a cross-sectional view of a display device according to an embodiment of the present disclosure.

FIG. 1 is a perspective view of a display device DD according to an embodiment of the present disclosure, and FIG. 2 is a cross-sectional view of the display device DD according to an embodiment of the present disclosure.

Referring to FIGS. 1 and 2, in an embodiment, the display device DD has a rectangular shape with long sides in a first direction DR1 and short sides in a second direction DR2 that crosses the first direction DR1. However, the shape of the display device DD is not necessarily limited thereto, and in other embodiments, the display device DD has a variety of other shapes, such as a circular shape, a polygonal shape, etc.

The display device DD is activated in response to electrical signals. The display device DD can be incorporated into various electronic devices. For example, the display device DD can be incorporated into a smart watch, a tablet computer, a notebook computer, a computer, or a smart television, etc.

Hereinafter, a normal line direction substantially perpendicular to a plane defined by the first direction DR1 and the second direction DR2 is referred to as a third direction DR3. In the following descriptions, the expression "when viewed in a plan view" refers a state of being viewed from the third direction DR3.

An upper surface of the display device DD is a display surface IS and is substantially parallel to the plane defined by the first direction DR1 and the second direction DR2. Images IM generated by the display device DD are displayed to a user through the display surface IS.

The display surface IS of the display device DD includes a transmission area TA and a bezel area BZA. The images IM are displayed through the transmission area TA. The user views the images IM through the transmission area TA. In an embodiment, the transmission area TA has a rectangular shape with rounded vertices. However, embodiments are not necessarily limited thereto, and in some embodiments, the transmission area TA has a variety of other shapes.

The bezel area BZA is adjacent to the transmission area TA. The bezel area BZA has a predetermined color. The bezel area BZA surrounds the transmission area TA. Accordingly, the shape of the transmission area TA is defined by the bezel area BZA, however, embodiments are not necessarily limited thereto. According to an embodiment, the bezel area BZA is disposed adjacent to only one, two or three sides of the transmission area TA or is omitted.

The display device DD senses an external input applied thereto. The external input may be one of a variety of external inputs. For example, the external input may be a hovering input applied when in proximity to or approaching close to the display device DD at a predetermined distance as well as a touch input from a part of a user's body, such as a hand of the user US_F, or from an additional device, such as an active pen, a digitizer, etc. In addition, the external input may have various forms, such as force, pressure, temperature, or light, etc.

The display device DD senses biometric information of the user that is applied thereto. The display device DD includes a biometric information sensing area in the display surface IS that senses the biometric information of the user. The biometric information sensing area may be an entire portion of the transmission area TA or may be a partial portion of the transmission area TA. FIG. 1 shows a structure in which the entire portion of the transmission area TA is used as the biometric information sensing area.

The display device DD includes a window WM, a display module DM, and a housing EDC. In an embodiment, the window WM and the housing EDC are coupled with each other and provide an appearance of the display device DD.

A front surface of the window WM is the display surface IS of the display device DD. The window WM includes an optically transparent insulating material. For example, the window WM includes a glass or a plastic material. The window WM may have a single-layer or a multi-layer structure. For example, the window WM includes a plurality of plastic films coupled to each other by an adhesive or a glass substrate and a plastic film coupled to the glass substrate by an adhesive.

The display module DM includes a display panel DP and an input sensing layer ISL. The display panel DP display the images IM in response to electrical signals, and the input sensing layer ISL senses an external input applied thereto. The external input may be provided in various forms.

The display panel DP according to an embodiment of the present disclosure is a light-emitting type display panel, however, embodiments are not necessarily limited thereto. For example, the display panel DP is one of an organic light emitting display panel or an inorganic light emitting display panel. A light emitting layer of an organic light emitting display panel includes an organic light emitting material. A light emitting layer of an inorganic light emitting display panel includes an inorganic light emitting material, such as a quantum dot or a quantum rod. Hereinafter, a organic light emitting display panel will be described as a representative example of the display panel DP.

Referring to FIG. 2, in an embodiment, the display panel DP includes abase layer BL, a pixel layer PXL, and a thin film encapsulation layer TFE. The display panel DP is a flexible display panel, however, embodiments of the present disclosure are not necessarily limited thereto. For example, the display panel DP is one of a foldable display panel that can be folded with respect to a folding axis, or a rigid display panel.

The base layer BL includes a synthetic resin layer. The synthetic resin layer may be a polyimide-based resin layer, however, a material for the synthetic resin layer is not necessarily limited thereto. In addition, the base layer BL includes at least one of a glass substrate, a metal substrate, or an organic/inorganic composite material substrate.

The pixel layer PXL is disposed on the base layer BL. The pixel layer PXL includes a circuit layer DP_CL and an element layer DP_ED. The circuit layer DP. CL is disposed between the base layer BL and the element layer DP_ED. The circuit layer DP_CL includes at least one insulating layer and a circuit element. Hereinafter, the insulating layer in the circuit layer DP_CL is referred to as an intermediate insulating layer. The intermediate insulating layer includes at least one intermediate inorganic layer and at least one intermediate organic layer. The circuit element includes a pixel driving circuit in each of the pixels that displays the images and a sensor driving circuit in each of the sensors that recognizes external information. The external information may be the biometric information. For example, the sensor is one of a fingerprint recognition sensor, a proximity sensor, or an iris recognition sensor. In addition, the sensor may be an optical sensor that optically recognizes the biometric information. The circuit layer DP_CL further includes signal lines connected to the pixel driving circuit and/or the sensor driving circuit.

The element layer DP_ED includes a light emitting element in each of the pixels and an optical sensing element in each of the sensors. For example, the optical sensing element is a photodiode. The optical sensing element may sense light reflected by a user's fingerprint or responds to light. The circuit layer DP_CL and the element layer DP_ED will be described in detail below.

The thin film encapsulation layer TFE encapsulates the element layer DP_ED. The thin film encapsulation layer TFE includes at least one organic layer and at least one inorganic layer. The inorganic layer includes an inorganic material and protects the element layer DP_ED from moisture and oxygen. The inorganic layer includes at least one of a silicon nitride layer, a silicon oxynitride layer, a silicon oxide layer, a titanium oxide layer, or an aluminum oxide layer, however, embodiments are not necessarily limited thereto. The organic layer includes an organic material and protects the element layer DP_ED from foreign substances such as dust particles. In an embodiment, the thin film encapsulation layer TFE has a three-layer structure of an inorganic layer/organic layer/inorganic layer.

The input sensing layer ISL is disposed on the display panel DP. The input sensing layer ISL is disposed directly on the thin film encapsulation layer TFE. The input sensing layer ISL is formed on the display panel DP through a plurality of successive processes. For example, an adhesive layer is not disposed between the input sensing layer ISL and the display panel DP.

The input sensing layer ISL senses an external input, such as a user's touch, converts the external input into a predetermined input signal, and transmits the input signal to the display panel DP. The input sensing layer ISL includes a plurality of input sensing electrodes, hereinafter referred to as sensing electrodes, that sense the external input. The sensing electrodes sense the external input by a mutual capacitance method or a self-capacitance method. The display panel DP receives an input signal from the input sensing layer ISL and generates an image that corresponds to the input signal.

The display module DM further includes an anti-reflective layer ARL. For example, the anti-reflective layer ARL is disposed on the input sensing layer ISL, however, embodiments of the present disclosure are not necessarily limited thereto. According to an embodiment, the anti-reflective layer ARL includes a plurality of color filters and a light blocking pattern. The input sensing layer ISL and the anti-reflective layer ARL will be described in detail below.

The display device DD further includes an adhesive layer AL The window WM is attached to the input sensing layer ISL by the adhesive layer AL. The adhesive layer AL includes one or more of an optically clear adhesive (OCA), an optically clear adhesive resin (OCR), or a pressure sensitive adhesive (PSA).

The housing EDC is coupled to the window WM. The housing EDC and the window WM coupled thereto provide a predetermined inner space. The display module DM is accommodated in the inner space. The housing EDC includes a highly rigid material. For example, the housing EDC includes at least one of a glass, plastic, or metal material, or a plurality of frames and/or plates of combinations thereof. The housing EDC stably protects the components of the display device DD accommodated in the inner space from external impacts. In addition, a battery module is disposed between the display module DM and the housing EDC to provide a power source for an overall operation of the display device DD.

Figure 3:
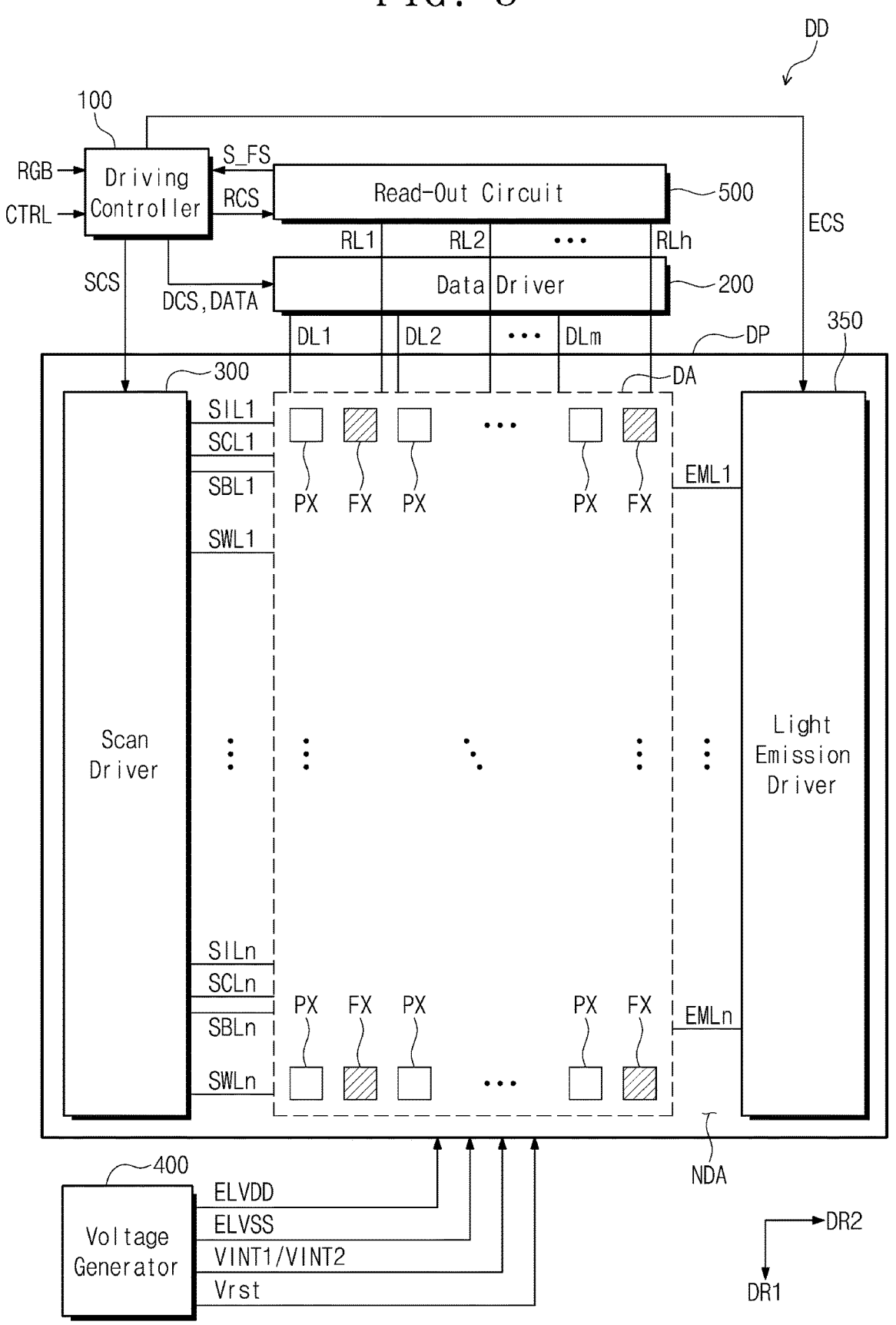
FIG. 3 is a block diagram of a display device according to an embodiment of the present disclosure.

FIG. 3 is a block diagram of the display device DD according to an embodiment of the present disclosure.

Referring to FIG. 3, in an embodiment, the display device DD includes the display panel DP, a driving controller 100, and a driving circuit. For example, the driving circuit includes a data driver 200, a scan driver 300, a light emission driver 350, a voltage generator 400, and a read-out circuit 500. The voltage generator 400 and the read-out circuit 500 can be implemented in a single driving chip with the driving controller 100.

The driving controller 100 receives an image signal RGB and control signals CTRL. The driving controller 100 converts a data format of the image signal RGB to a data format appropriate for an interface between the data driver 200 and the driving controller 100 and generates image data signal DATA. The driving controller 100 also generates a first control signal SCS, a second control signal ECS, a third control signal DCS, and a fourth control signal RCS.

The data driver 200 receives the third control signal DCS and the image data signal DATA from the driving controller 100. The data driver 200 converts the image data signal DATA into data signals and outputs the data signals to a plurality of data lines DL1 to DLm that are described below. The data signals are analog voltages that correspond to grayscale values of the image data signal DATA.

The scan driver 300 receives the first control signal SCS from the driving controller 100. The scan driver 300 outputs scan signals to scan lines in response to the first control signal SCS.

The voltage generator 400 generates voltages that operate the display panel DP. In an embodiment, the voltage generator 400 generates a first driving voltage ELVDD, a second driving voltage ELVSS, a first initialization voltage VINT1, and a second initialization voltage VINT2.

The display panel DP include a display area DA that corresponds to the transmission area TA (see FIG. 1) and a non-display area NDA that corresponds to the bezel area BZA (see FIG. 1).

The display panel DP includes a plurality of pixels PX disposed in the display area DA and a plurality of sensors FX disposed in the display area DA. For example, each of the sensors FX is disposed between two adjacent pixels PX. The pixels PX and the sensors FX are alternately arranged with each other in the first and second directions DR1 and DR2, however, embodiments of the present disclosure are not necessarily limited thereto. For example, in an embodiment, two or more pixels PX are disposed between two adjacent sensors FX in the first direction DR1, or two or more pixels PX are disposed between two adjacent sensors FX in the second direction DR2.

The display panel DP includes initialization scan lines SIL1 to SILn, compensation scan lines SCL1 to SCLn, write scan lines SWL1 to SWLn, black scan lines SBL1 to SBLn, light emission control lines EML1 to EMLn, the data lines DL1 to DLm, and read-out lines RL1 to RLh. The initialization scan lines SIL1 to SILn, the compensation scan lines SCL1 to SCLn, the write scan lines SWL1 to SWLn, the black scan lines SBL1 to SBLn, and the light emission control lines EML1 to EMLn extend in the second direction DR2. The initialization scan lines SIL1 to SILn, the compensation scan lines SCL1 to SCLn, the write scan lines SWL1 to SWLn, the black scan lines SBL1 to SBLn, and the light emission control lines EML1 to EMLn are spaced apart from each other in the first direction DR1. The data lines DL1 to DLm and the read-out lines RL1 to RLh extend in the first direction DR1 and are spaced apart from each other in the second direction DR2.

The pixels PX are electrically connected to the initialization scan lines SIL1 to SILn, the compensation scan lines SCL1 to SCLn, the write scan lines SWL1 to SWLn, the black scan lines SBL1 to SBLn, the light emission control lines EML1 to EMLn, and the data lines DL1 to DLm. Each of the pixels PX is electrically connected to four scan lines. However, the number of the scan lines connected to each of the pixels PX is not necessarily limited thereto.

The sensors FX are electrically connected to the write scan lines SWL1 to SWLn and the read-out lines RL1 to RLh. Each of the sensors FX is electrically connected to one scan line, however, embodiments of the present disclosure are not necessarily limited thereto. In some embodiments, the number of the scan lines connected to each of the sensors FX varies. For example, the number of the read-out lines RL1 to RLh corresponds to a half (½) of the number of the data lines DL1 to DLm, however, embodiments of the present disclosure are not necessarily limited thereto. In some embodiments, the number of the read-out lines RL1 to RLh corresponds to a ¼ or ⅛ of the number of the data lines DL1 to DLm.

The scan driver 300 is disposed in the non-display area NDA of the display panel DP. The scan driver 300 receives the first control signal SCS from the driving controller 100. In response to the first control signal SCS, the scan driver 300 outputs initialization scan signals to the initialization scan lines SIL1 to SILn and outputs compensation scan signals to the compensation scan lines SCL1 to SCLn. In addition, in response to the first control signal SCS, the scan driver 300 outputs write scan signals to the write scan lines SWL1 to SWLn and outputs black scan signals to the black scan lines SBL1 to SBLn. In some embodiments, the scan driver 300 includes first and second scan drivers. The first scan driver outputs the initialization scan signals and the compensation scan signals, and the second scan driver outputs the write scan signals and the black scan signals.

The light emission driver 350 is disposed in the non-display area NDA of the display panel DP. The light emission driver 350 receives the second control signal ECS from the driving controller 100. The light emission driver 350 outputs light emission control signals to the light emission control lines EML1 to EMLn in response to the second control signal ECS. According to an embodiment, alternatively, the scan driver 300 is connected to the light emission control lines EML1 to EMLn. In this case, the light emission driver 350 is omitted, and the scan driver 300 outputs the light emission control signals to the light emission control lines EML1 to EMLn.

The read-out circuit 500 receives the fourth control signal RCS from the driving controller 100. The read-out circuit 500 receives sensing signals from the read-out lines RL1 to RLh in response to the fourth control signal RCS. The read-out circuit 500 process the sensing signals from the read-out lines RL1 to RLh and provides the processed sensing signals S_FS to the driving controller 100. The driving controller 100 can recognize the biometric information based on the sensing signals S_FS.

Figure 4:
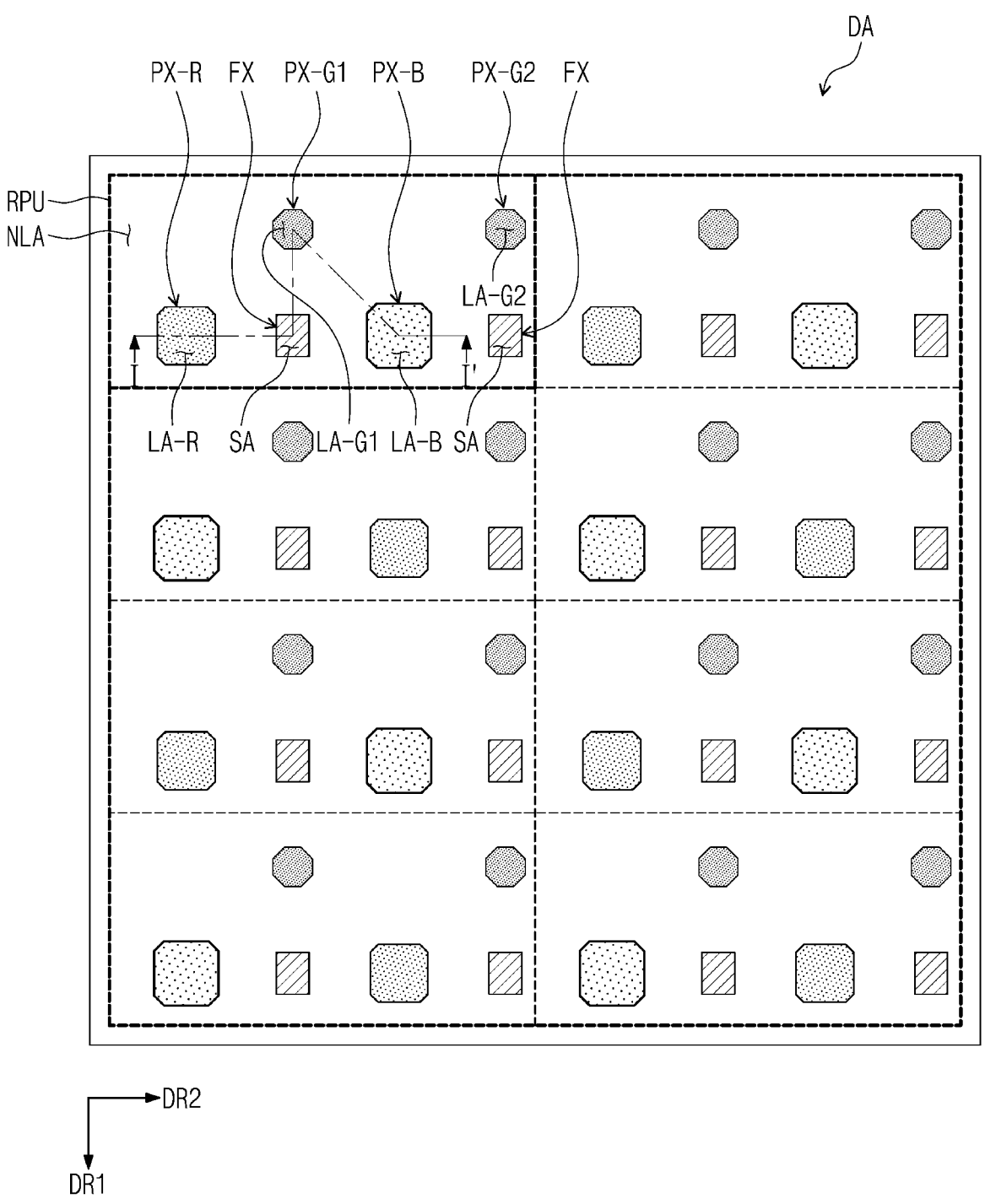
FIG. 4 is an enlarged plan view of a portion of a display panel according to an embodiment of the present disclosure.

FIG. 4 is an enlarged plan view of a portion of the display area DA according to an embodiment of the present disclosure.

According to an embodiment, FIG. 4 shows unit areas RPU repeatedly arranged in the display area DA. A unit pixel and at least one sensor FX are disposed in each unit area RPU. The unit pixel is a group of the pixels shown in FIG. 3, and a plurality of unit pixels are provided and repeatedly arranged.

The unit pixel includes a first color pixel PX-R, two second color pixels PX-G1 and PX-G2, and a third color pixel PX-B. In an embodiment, a first color is red, a second color is green, and a third color is blue. In an embodiment, two sensors FX are disposed in each of the unit areas RPU. The first color pixel PX-R includes a first color light emitting element, each of two second color pixels PX-G1 and PX-G2 include a second color light emitting element, and the third color pixel PX-B includes a third color light emitting element.

FIG. 4 shows a first light emitting area LA-R of the first color light emitting element, second light emitting areas LA-G1 and LA-G2 of the second color light emitting elements, and a third light emitting area LA-B of the third color light emitting element. Of the first light emitting area LA-R, the second light emitting areas LA-G1 and LA-G2, and the third light emitting area LA-B, the third light emitting area LA-B has the largest size, and the second light emitting areas LA-G1 and LA-G2 have the smallest size. In addition, a sensing area SA of each of the optical sensing elements of the two sensors FX is shown in FIG. 4. One first color light emitting element, two second color light emitting elements, and one third color light emitting element define a unit light emitting element, and one first light emitting area LA-R, two second light emitting areas LA-G1 and LA-G2, and one third light emitting area LA-B define the unit light emitting area. The unit light emitting are is surrounded by a non-light emitting area NLA.

The unit areas RPU arranged in the second direction DR2 have the same pixel arrangement, and the positions of the first color pixel PX-R and the third color pixel PX-B are swapped in each of the unit areas RPU arranged in the first direction DR1. Of the unit areas RPU, first type unit areas are alternately arranged with second type unit areas along the first direction DR1.

Referring to each of the unit areas RPU, the second light emitting areas LA-G1 and LA-G2 are aligned in the second direction DR2. Each of the sensing areas SA is aligned with a corresponding second light emitting area LA-G1 or LA-G2 in the first direction DR1.

In the second direction DR2, the first light emitting area LA-R, the third light emitting area LA-B, and the sensing areas SA are aligned with each other. One sensing area SA is disposed between the first light emitting area LA-R and the third light emitting area LA-B, and one of the first light emitting area LA-R or the third light emitting area LA-B is disposed between two sensing areas SA.

Referring to FIG. 4, in an embodiment, each of the sensing areas SA is disposed at a center between the first light emitting area LA-R and the third light emitting area LA-B and a center between two second light emitting areas LA-G1 and LA-G2 in unit areas RPU adjacent in the first direction DR1. Each of the sensing areas SA is disposed between the first light emitting area LA-R and the third light emitting area LA-B in the second direction DR2 and is disposed between two second light emitting areas LA-G1 or between two second light emitting areas LA-G2 in the first direction DR1.

Figure 5A:
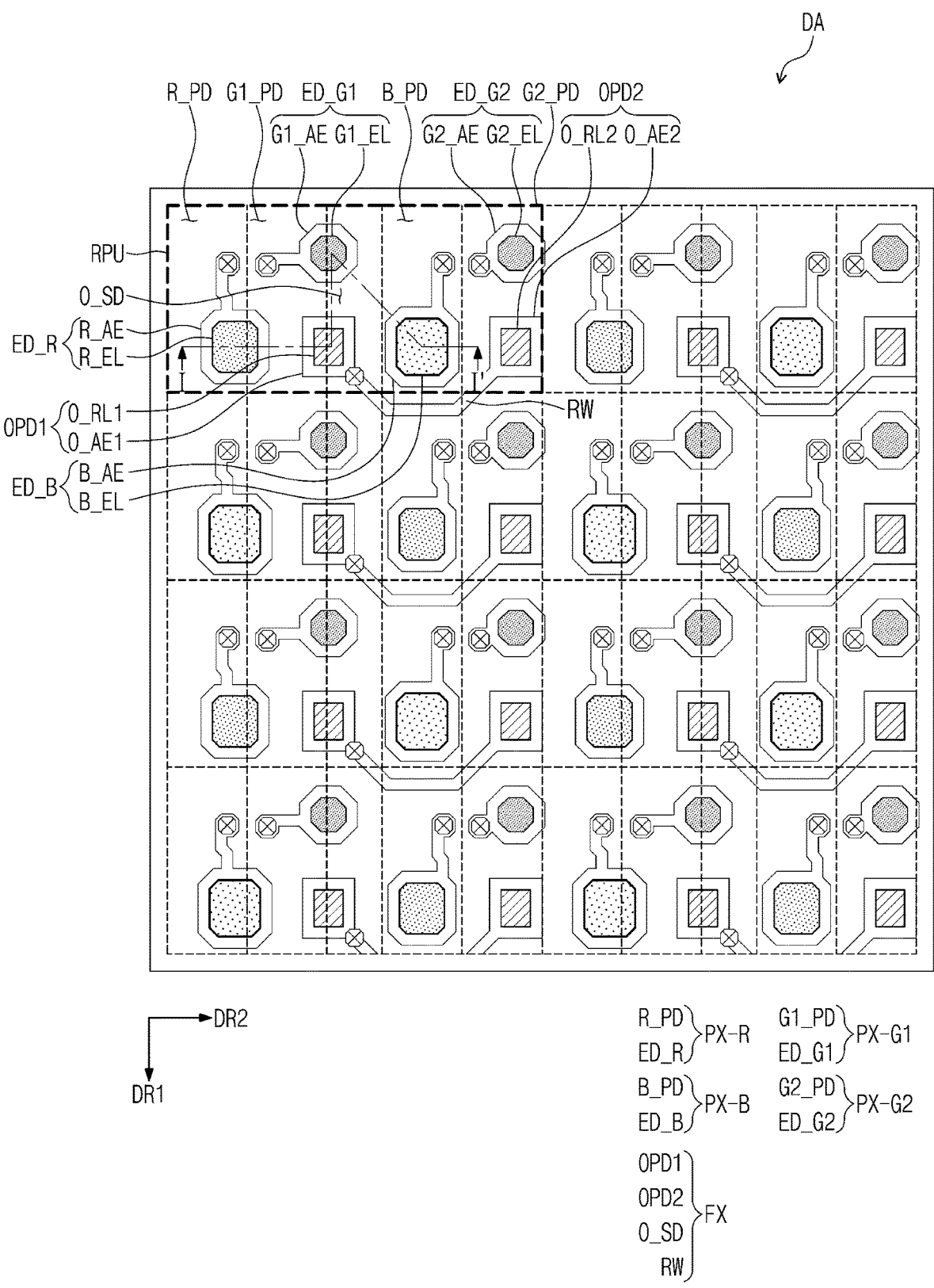
FIG. 5A is a plan view of a connection relationship between an optical sensing element and a sensor driving circuit according to an embodiment of the present disclosure.
Figure 5B:
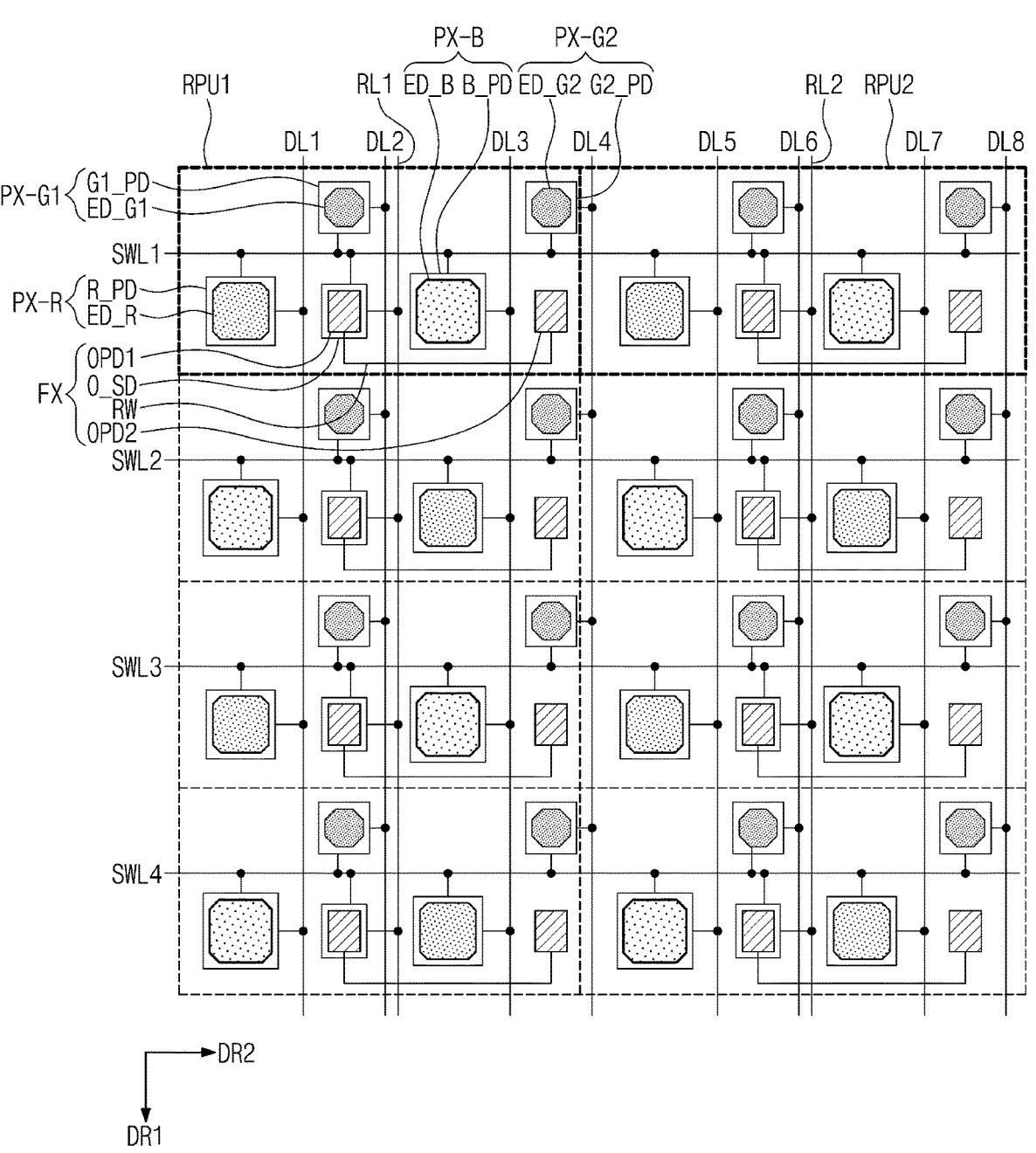
FIG. 5B is a circuit diagram of a connection relationship between an optical sensing element and a sensor driving circuit according to an embodiment of the present disclosure.
Figure 5C:
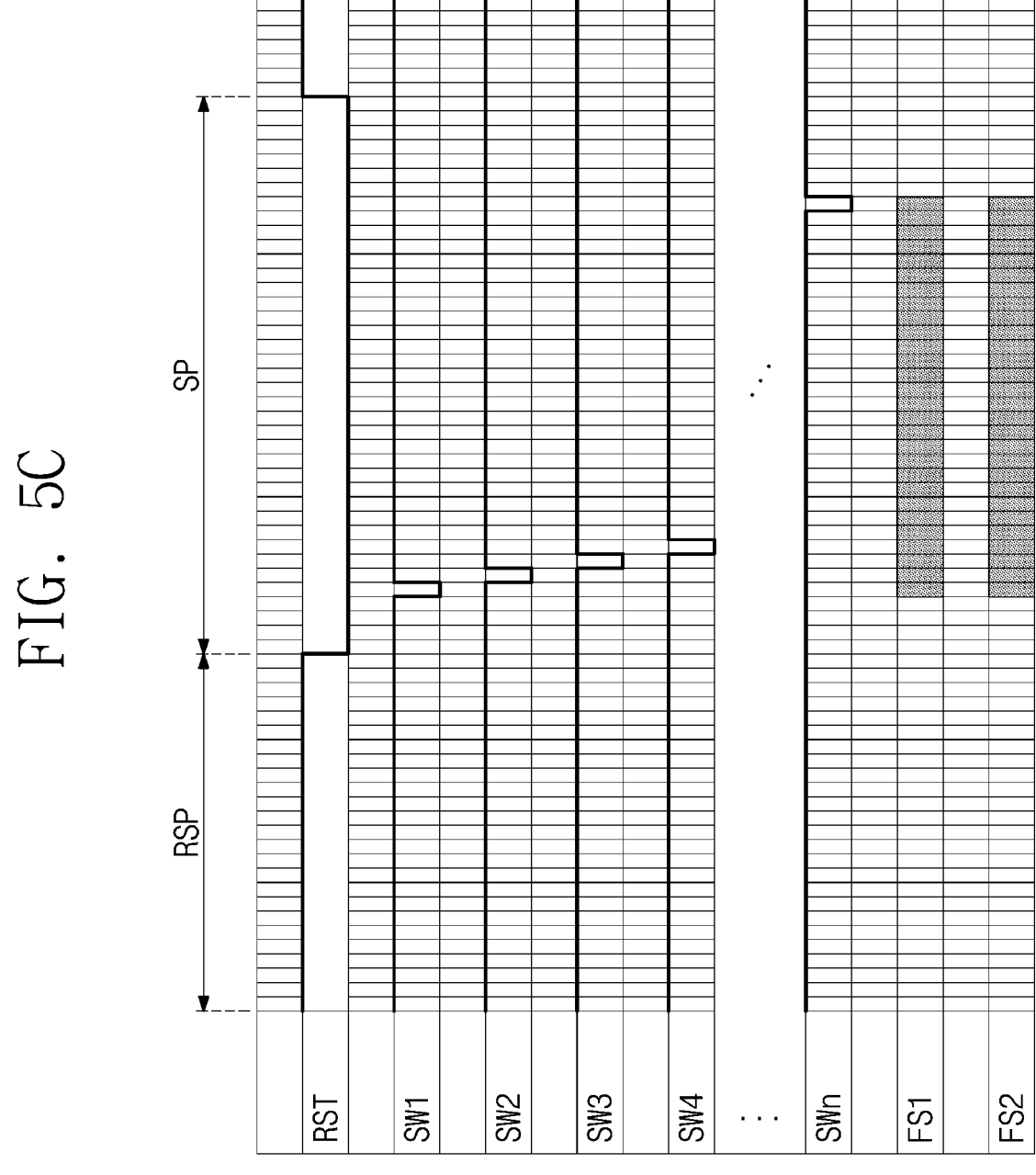
FIG. 5C is a waveform diagram of a read-out timing of sensors shown in FIG. 5B according to an embodiment of the present disclosure.

FIG. 5A is a plan view of a connection relationship between the light emitting element and the pixel driving circuit and a connection relationship between the optical sensing element and the sensor driving circuit according to an embodiment of the present disclosure. FIG. 5B is a circuit diagram of the connection relationship between the light emitting element and the pixel driving circuit and the connection relationship between the optical sensing element and the sensor driving circuit shown in FIG. 5A. FIG. 5C is a waveform diagram of a read-out timing of sensors shown in FIG. 5B according to an embodiment of the present disclosure.

Hereinafter, the first color pixel PX-R is defined as a red pixel, the second color pixels PX-G1 and PX-G2 are defined as green pixels, and the third color pixel PX-B is defined as a blue pixel. In addition, the first color light emitting element is a red light emitting element ED_R, the second color light emitting element is a green light emitting element ED_G, and the third color light emitting element is a blue light emitting element ED_B.

Referring to FIG. 5A, in an embodiment, a first electrode R_AE and a light emitting layer R_EL of the red light emitting element ED_R are shown as corresponding to the first light emitting area LA-R shown in FIG. 4. A first electrode G1_AE and a light emitting layer G1_EL of a first green light emitting element ED_G1 are shown as corresponding to one of the second light emitting areas LA-G1 and LA-G2, and a first electrode G2_AE and a light emitting layer G2_EL of a second green light emitting element ED_G2 are shown as corresponding to the other of the second light emitting areas LA-G1 and LA-G2. A first electrode B_AE and a light emitting layer B_EL of the blue light emitting element ED_B are shown as corresponding to the third light emitting area LA-B. A first electrode O_AE1 and a photoelectric conversion layer O_RL1 of a first optical sensing element OPD1 are shown as corresponding to one of the two sensing areas SA within the unit area RPU, and a first electrode O_AE2 and a photoelectric conversion layer O_RL2 of a second optical sensing element OPD2 are shown as corresponding to the other of the two sensing areas SA.

A pixel driving circuit R_PD of the red pixel PX-R, a pixel driving circuit G1_PD of a first green pixel PX-G1, a pixel driving circuit G2_PD of a second green pixel PX-G2, a pixel driving circuit B_PD of the blue pixel PX-B, and a sensor driving circuit O_SD are disposed in the unit area RPU.

Each of the first electrodes R_AE, G1_AE. G2_AE, and B_AE of the light emitting elements ED_R, ED_G1, ED_G2, and ED_B are electrically connected to a respective corresponding pixel driving circuit R_PD, G1_PD, G2_PD, and B_PD. For example, the red light emitting element ED_R is electrically connected to the pixel driving circuit R_PD. For example, the first electrode R_AE of the red light emitting element ED_R is connected to the corresponding pixel driving circuit R_PD through a contact hole.

The sensor FX includes a first optical sensing element OPD1, a second optical sensing element OPD2, and the sensor driving circuit O_SD. In an embodiment, the first optical sensing element OPD1 and the second optical sensing element OPD2 are electrically connected to one sensor driving circuit O_SD. The sensor FX further includes a routing line RW that electrically connects the first and second optical sensing elements OPD1 and OPD2. The first electrode O_AE1 of the first optical sensing element OPD1 is connected to the first electrode O_AE2 of the second optical sensing element OPD2 by the routing line RW, and the first electrode O_AE1 of the first optical sensing element OPD1 is connected to the sensor driving circuit O_SD through a contact hole. However, embodiments are not necessarily limited thereto. According to an embodiment, the first optical sensing element OPD1 and the second optical sensing element OPD2 are connected to sensor driving circuits O_SD that differ from each other. An embodiment has a same structure as that in which two sensors FX are disposed in one unit area RPU.

FIG. 5B schematically shows the connection relationship between the write scan lines SWL1 to SWL4, the read-out lines RL1 and RL2, and the data lines DL1 to DL8 and the pixels PX-R, PX-G1, PX-G2, and PX-B and the sensor FX. Descriptions will be based on a first unit area RPU1 and a second unit area RPU2 that are arranged in the second direction DR2.

Each of the pixels PX-R, PX-G1, PX-G2, and PX-B is connected to four scan lines, such as the write scan line, the compensation scan line, the initialization scan line, and the black scan line. For convenience of illustration, FIG. 5B show only one of the four scan lines such as the write scan line.

FIG. 5B shows four write scan lines SWL1 to SWL4 of the write scan lines SWL1 to SWLn (see FIG. 3), eight data lines DL1 to DL8 of the data lines DL1 to DLm (see FIG. 3), and two read-out lines RL1 and RL2 of the read-out lines RL1 to RLh (see FIG. 3).

According to an embodiment, the pixels PX-R, PX-G1, PX-G2, and PX-B arranged in a first unit area RPU1 are connected to a first write scan line SWL1 and first to fourth data lines DL1 to DL4. The pixels PX-R, PX-G1, PX-G2, and PX-B arranged in a second unit area RPU2 are connected to the first write scan line SWL1 and fifth to eighth data lines DL5 to DL8. The sensor FX disposed in the first unit area RPU1 is connected to the first write scan line SWL1 and a first read-out line RL1, and the sensor FX disposed in the second unit area RPU2 is connected to the first write scan line SWL1 and a second read-out line RL2.

Referring to FIGS. SB and SC, in an embodiment, the sensor driving circuit O_SD outputs first and second sensing signals FS1 and FS2 to the first and second read-out lines RL1 and RL2, respectively, during an activation period of the write scan signals SW1 to SW4 applied to the corresponding write scan lines SWL1 to SWL4. A period in which the first and second sensing signals FS1 and FS2 are output is defined as a sensing period SP. A period in which the sensor driving circuit O_SD is reset prior to the sensing period SP is defined as a reset period RSP. The reset period RSP and the sensing period SP are alternately repeated. According to an embodiment of the present disclosure, a plurality of sensing periods SP are positioned between two reset periods RSP.

Figure 6A:
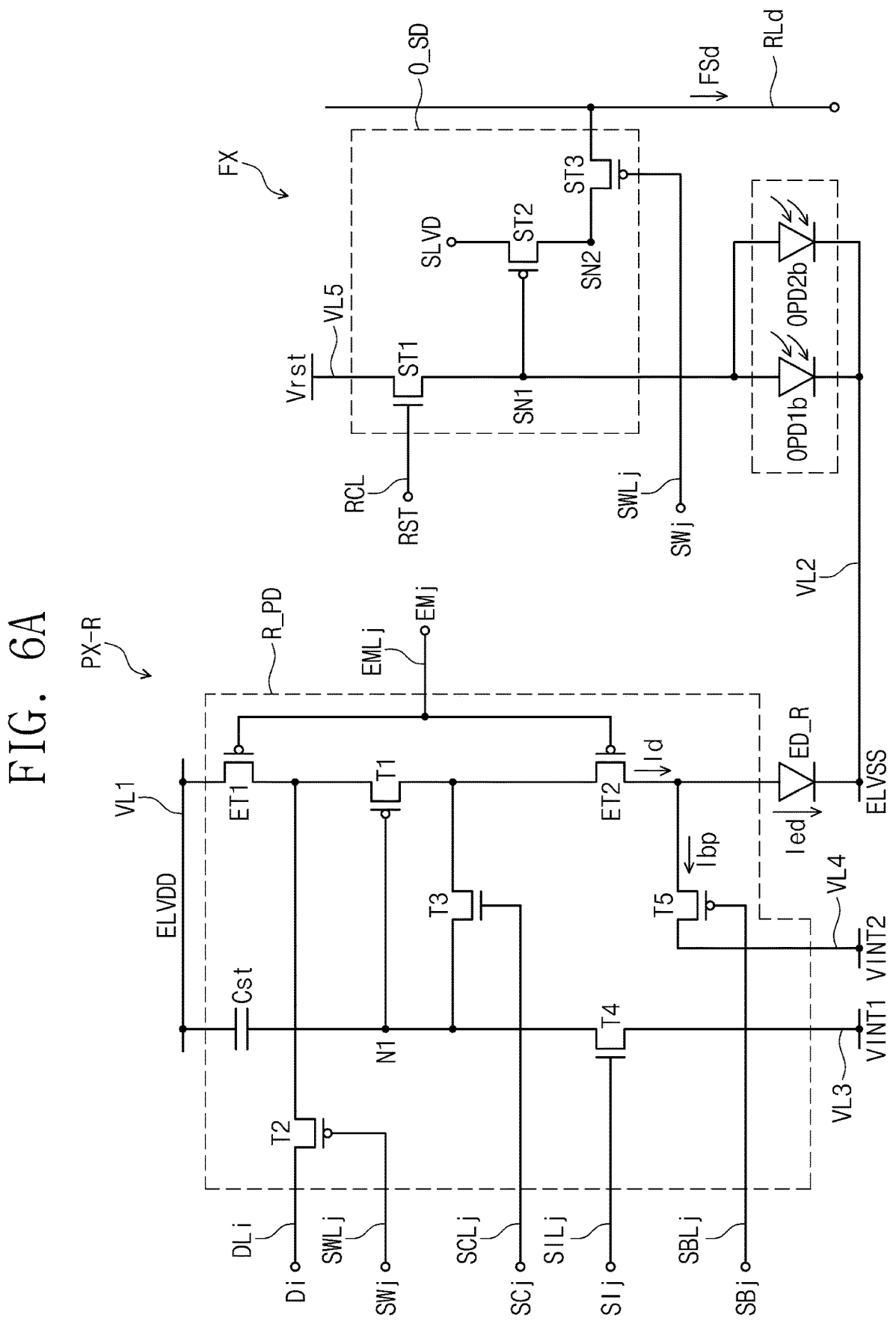
FIG. 6A is a circuit diagram of a pixel and a sensor according to an embodiment of the present disclosure.
Figure 6B:
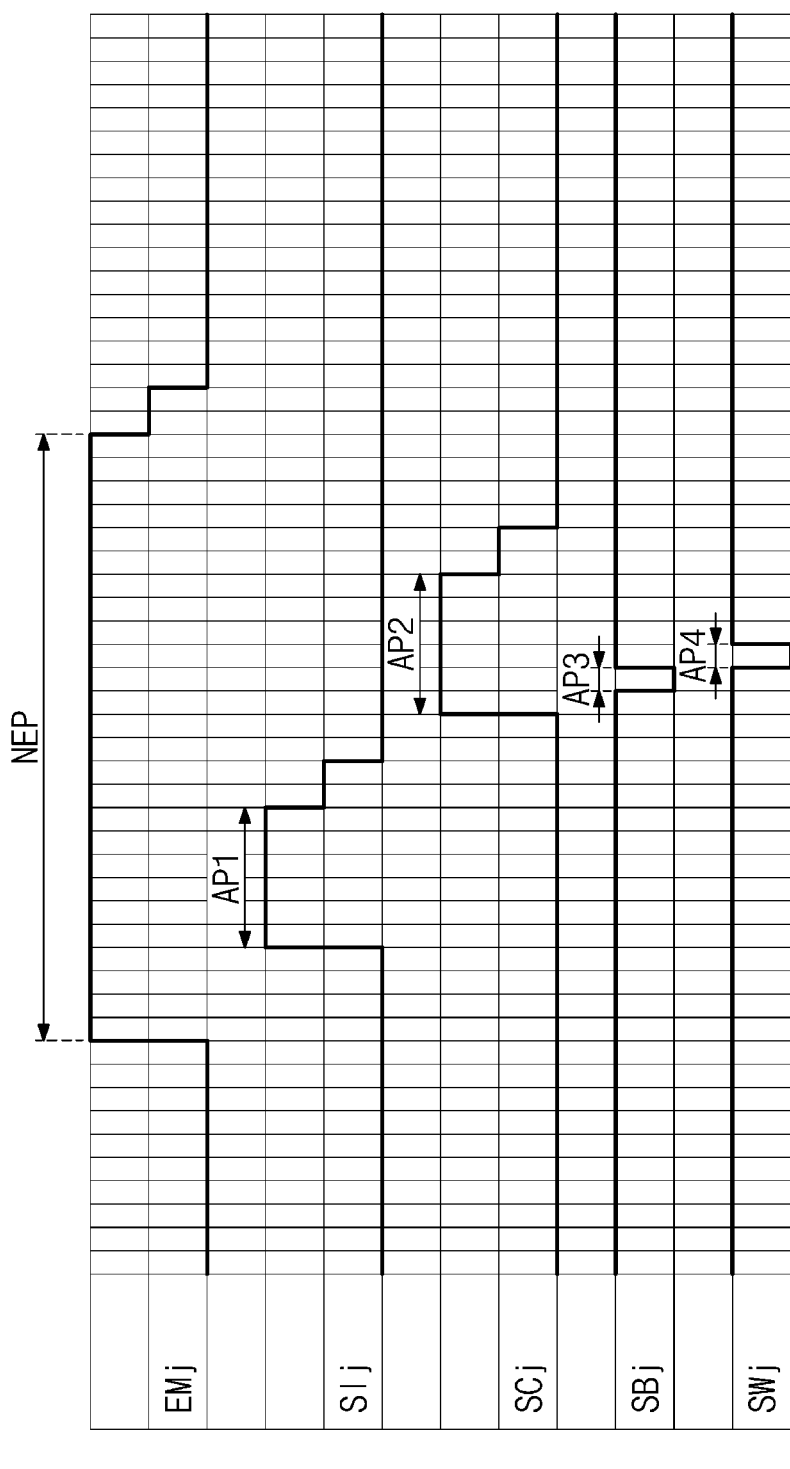
FIG. 6B is a waveform diagram of an operation of a pixel and a sensor of FIG. 6A.

FIG. 6A is a circuit diagram of the pixel PX-R and the sensor FX according to an embodiment of the present disclosure, and FIG. 6B is a waveform diagram of an operation of the pixel PX-R and the sensor FX of FIG. 6A.

FIG. 6A shows an equivalent circuit diagram of the red pixel PX-R shown in FIG. 3. Since the pixels PX have substantially the same circuit structure, a description of the circuit structure will be based on the red pixel PX-R, and details of other pixels will be omitted. In addition, FIG. 6A shows an equivalent circuit diagram of one of the sensors FX shown in FIG. 3. Since the sensors FX have substantially the same circuit structure, the circuit structure of one sensor FX will be described in detail, and details of other sensors will be omitted.

Referring to FIG. 6A, in an embodiment, the red pixel PX-R is connected to an i-th data line DLi, a j-th initialization scan line SILj, a j-th compensation scan line SCLj, a j-th write scan line SWLj, a j-th black scan line SBLj, and a j-th light emission control line EMLj.

The pixel driving circuit R_PD includes first, second, third, fourth, and fifth transistors T1, T2, T3, T4, and T5, first and second light emission control transistors ET1 and ET2, and one capacitor Cst. At least one of the first to fifth transistors T1 to T5 and the first and second light emission control transistors ET1 and ET2 includes a low-temperature polycrystalline silicon (LTPS) semiconductor layer. Some of the first to fifth transistors T1 to T5 and the first and second light emission control transistors ET1 and ET2 are P-type transistors, and the other transistors are N-type transistors. For example, each of the first, second, and fifth transistors T1, T2, and T5 and the first and second light emission control transistors ET1 and ET2 is a PMOS transistor, and each of the third and fourth transistors T3 and T4 is an NMOS transistor. Hereinafter, a source, a drain, and agate of the first, second, and fifth transistors T1, T2, and T5 and the first and second light emission control transistors ET1 and ET2 will be described based on the PMOS transistor, and a source, a drain, and a gate of the third and fourth transistors T3 and T4 will be described based on the NMOS transistor.

At least one of the first to fifth transistors T1 to T5 and the first and second light emission control transistors ET1 and ET2 includes an oxide semiconductor layer. For example, each of the third and fourth transistors T3 and T4 is an oxide semiconductor transistor, and each of the first, second, and fifth transistors T1, T2, and T5 and each of the first and second light emission control transistors ET1 and ET2 is a silicon transistor.

The circuit structure of the pixel driving circuit R_PD is not necessarily be limited to an embodiment shown in FIG. 6A, and in an embodiment, the circuit structure of the red pixel driving circuit R_PD is changed. For example, in an embodiment, all of the first to fifth transistors T1 to T5 and the first and second light emission control transistors ET1 and ET2 may be P-type transistors or N-type transistors.

The j-th initialization scan line SILj, the j-th compensation scan line SCLj, the j-th write scan line SWLj, the j-th black scan line SBLj, and the j-th light emission control line EMLj transmit a j-th initialization scan signal SIj, a j-th compensation scan signal SCj, a j-th write scan signal SWj, a j-th black scan signal SBj, and a j-th light emission control signal EMj to the red pixel PX-R, respectively. The i-th data line DLi transmits an i-th data signal Di to the red pixel PX-R. The i-th data signal Di has a voltage level that corresponds to the image signal RGB see FIG. 3) input to the display device DD (see FIG. 3).

First and second driving voltage lines VL1 and VL2 respectively transmit the first driving voltage ELVDD and the second driving voltage ELVSS to the red pixel PX-R. In addition, first and second initialization voltage lines VL3 and VL4 respectively transmit the first initialization voltage VINT1 and the second initialization voltage VINT2 to the red pixel PX-R.

The first transistor T1 is connected between the first driving voltage line VL1 to which the first driving voltage ELVDD is applied and the red light emitting element ED_R. The first transistor T1 includes the source connected to the first driving voltage line VL through the first light emission control transistor ET1, the drain connected to the first electrode R_AE (see FIG. 5A) of the red light emitting element ED_R through the second light emission control transistor ET2, and the gate connected to one end of the capacitor Cst through a first node N1. The first transistor T1 receives the i-th data signal Di through the i-th data line DLi according to a switching operation of the second transistor T2 and supplies a driving current Id to the red light emitting element ED_R.

The second transistor T2 is connected between the data line DLi and the source of the first transistor T1. The second transistor T2 includes the source connected to the data line DLi, the drain connected to the source of the first transistor T1, and the gate connected to the j-th write scan line SWLj. The second transistor T2 is turned on in response to the write scan signal SWj received through the j-th write scan line SWLj and transmits the i-th data signal Di received from the i-th data line DLi to the source of the first transistor T1.

The third transistor T3 is connected between the drain of the first transistor T1 and the first node N1. The third transistor T3 includes the source connected to the gate of the first transistor T1, the drain connected to the drain of the first transistor T1, and the gate connected to the j-th compensation scan line SCLj. The third transistor T3 is turned on in response to the j-th compensation scan signal SCj received through the j-th compensation scan line SCLj and connects the drain and the gate of the first transistor T1, and thus connects the first transistor T1 in a diode configuration.

The fourth transistor T4 is connected between the first initialization voltage line VL3 through which the first initialization voltage VINT1 is applied and the first node N1. The fourth transistor T4 includes the source connected to the first initialization voltage line VL3 that transmits the first initialization voltage VINT1, the drain connected to the first node N1, and the gate connected to the j-th initialization scan line SILj. The fourth transistor T4 is turned on in response to the j-th initialization scan signal SIj received through the j-th initialization scan line SILj. The turned-on fourth transistor T4 supplies the first initialization voltage VINT1 to the first node N1 to initialize an electric potential of the gate of the first transistor T1, such as an electric potential of the first node N1.

The first light emission control transistor ET1 includes the source connected to the first driving voltage line VL1, the drain connected to the source of the first transistor T1, and the gate connected to the j-th light emission control line EMLj. The second light emission control transistor ET2 includes the source connected to the drain of the first transistor T1, the drain connected to the first electrode R_AE (see FIG. 5A) of the red light emitting element ED_R, and the gate connected to the j-th light emission control line EMLj. The first and the second light emission control transistors ET1 and ET2 are substantially simultaneously turned on in response to the j-th light emission control signal EMj received through the j-th light emission control line EMLj. The first driving voltage ELVDD that is transmitted through the turned-on first light emission control transistor ET1 is compensated for by the diode-configured first transistor T1 and then is supplied to the red light emitting element ED_R.

The fifth transistor T5 includes the drain connected to the second initialization voltage line VL4 through which the second initialization voltage VINT2 is applied, the source connected to the drain of the second light emission control transistor ET2, and the gate connected to the black scan line SBLj. The second initialization voltage VINT2 has a voltage level equal to or less than that of the first initialization voltage VINT1.

As described above, the one end of the capacitor Cst is connected to the gate of the first transistor T1, and the other end of the capacitor Cst is connected to the first driving voltage line VL1. A second electrode (or a cathode) of the red light emitting element ED_R is connected to the second driving voltage line VL2 that transmits the second driving voltage ELVSS. The second driving voltage ELVSS has a voltage level that is less than that of the first driving voltage ELVDD. For example, the second driving voltage ELVSS has a voltage level that is less than that of the first and second initialization voltages VINT1 and VINT2.

Referring to FIGS. 6A and 6B, in an embodiment, the j-th light emission control signal EMj has a high level during a non-light-emitting period NEP. The j-th initialization scan signal SIj is activated within the non-light-emitting period NEP. When the high level j-th initialization scan signal SIj is provided through the j-th initialization scan line SILj during an activation period AP1, hereinafter, referred to as a first activation period, of the j-th initialization scan signal SIj, the fourth transistor T4 is turned on in response to the high level j-th initialization scan signal SIj. The first initialization voltage VINT1 is applied to the gate of the first transistor T1 through the turned-on fourth transistor T4, and the first node N1 is initialized to the first initialization voltage VINT1. Accordingly, the first activation period AP1 is an initialization period of the red pixel PX-R.

Then, when the j-th compensation scan signal SCj is activated and the high level j-th compensation scan signal SCj is provided through the j-th compensation scan line SCLj during an activation period AP2, hereinafter referred to as a second activation period, of the j-th compensation scan signal SCj, the third transistor T3 is turned on. The first transistor T1 is diode-connected by the third transistor T3 and is forward biased. The first activation period AP1 does not overlap the second activation period AP2.

The j-th write scan signal SWj is activated within the second activation period AP2. The j-th write scan signal SWj has a low level during an activation period AP4, hereinafter referred to as a fourth activation period. The second transistor T2 is turned on in response to the low level j-th write scan signal SWj during the fourth activation period AP4. Then, a compensation voltage Di-Vth reduced by a threshold voltage Vth of the first transistor T1 from the i-th data signal Di received through the i-th data line DLi is applied to the gate of the first transistor T1. For example, an electric potential of the gate of the first transistor T1 is the compensation voltage Di-Vth. The fourth activation period AP4 overlaps the second activation period AP2. A duration of the second activation period AP2 is greater than a duration of the fourth activation period AP4.

The first driving voltage ELVDD and the compensation voltage Di-Vth are respectively applied to both ends of the capacitor Cst, and the capacitor Cst is electrically charged to a level that corresponds to a difference in voltage between the ends of the capacitor Cst. A high level period of the j-th compensation scan signal SCj is referred to a compensation period of the red pixel PX-R.

Meanwhile, the j-th black scan signal SBj is activated within the second activation period AP2 of the j-th compensation scan signal SCj. The j-th black scan signal SBj has a low level during an activation period AP3, hereinafter referred to as a third activation period. During the third activation period AP3, the fifth transistor T5 is turned on in response to the low level j-th black scan signal SBj received through the j-th black scan line SBLj. A portion of the driving current Id is redirected as a bypass current Ibp through the fifth transistor T5. The third activation period AP3 overlaps the second activation period AP2. The duration of the second activation period AP2 is greater than a duration of the third activation period AP3. The third activation period AP3 precedes the fourth activation period AP4 and does not overlap the fourth activation period AP4.

When the red pixel PX-R displays a black image, the red light emitting element ED_R emits light even though a minimum driving current of the first transistor T1 flows as the driving current Id, and thus the red pixel PX-R does not properly display the black image. Therefore, the fifth transistor T5 of the red pixel PX-R according to an embodiment of the present disclosure distributes a portion of the minimum driving current of the first transistor T1 to another current path as the bypass current Ibp rather than through a current path to the red light emitting element ED_R. For example, the minimum driving current of the first transistor T1 is a current that flows to the first transistor T1 under a condition that a gate-source voltage Vgs of the first transistor T1 is less than the threshold voltage Vth and the first transistor T1 is turned off. In this way, when the minimum driving current flows to the first transistor T1 under the condition that the first transistor T1 is turned off, a current is transmitted to the red light emitting element ED_R, and an image with a black grayscale is displayed. For example, the currently is less than about 10 pA. When the red pixel PX-R displays a black image, an influence of the bypass current Ibp with respect to the minimum driving current is relatively large, however, when images, such as normal images or white images, are displayed, the influence of the bypass current Ibp with respect to the driving current Id is negligible. Accordingly, when a black image is displayed, a light emitting current Ied that is reduced from the driving current Id by an amount of the bypass current Ibp flows to the red light emitting element ED_R, and thus, a black image is clearly displayed. Thus, the red pixel PX-R displays an accurate black grayscale image using the fifth transistor T5, and as a result, a contrast ratio is increased.

Then, a level of the j-th light emission control signal EMj received from the j-th light emission control line EMLj changes from the high level to the low level. The first and second light emission control transistors ET1 and ET2 are turned on in response to the low level j-th light emission control signal EMj. As a result, the driving current Id is generated due to a voltage difference between the voltage of the gate of the first transistor T1 and the first driving voltage ELVDD, the driving current Id flows to the red light emitting element ED_R through the second light emission control transistor ET2, and the light emitting current Ied flows through the red light emitting element ED_R.

Referring to FIG. 6A again, in an embodiment, the sensor FX is connected to a d-th read-out line RLd of the read-out lines RL1 to RLh, the j-th write scan line SWLj, and a reset control line RCL.

The sensor FX includes at least one optical sensing element, such as OPD1 and OPD2, and the sensor driving circuit O_SD. Two optical sensing elements OPD1 and OPD2 are shown as being connected to each other in parallel as a representative example. The first and second optical sensing elements OPD1 and OPD2 are connected to a first sensing node SN1, and second electrodes of the first and second optical sensing elements OPD1 and OPD2 are connected to the second driving voltage line VL2 that transmits the second driving voltage ELVSS.

The sensor driving circuit O_SD include three transistors ST1, ST2, and ST3. The three transistors ST1 to ST3 are a reset transistor ST1, an amplification transistor ST2, and an output transistor ST3. At least one of the reset transistor ST1, the amplification transistor ST2, and the output transistor ST3 is an oxide semiconductor transistor. For example, the reset transistor ST1 is the oxide semiconductor transistor, and the amplification transistor ST2 and the output transistor ST3 are silicon transistors, however, embodiments of the present disclosure are not necessarily limited thereto. According to an embodiment, at least the reset transistor ST1 and the output transistor ST3 are the oxide semiconductor transistors, and the amplification transistor ST2 is the silicon transistor.

In addition, some of the reset transistor ST1, the amplification transistor ST2, and the output transistor ST3 are P-type transistors, and the other transistors are N-type transistors. For example, the amplification transistor ST2 and the output transistor ST3 are PMOS transistors, and the reset transistor ST1 is a NMOS transistor, however, embodiments of the present disclosure are not necessarily limited thereto. According to an embodiment, each of the reset transistor ST1, the amplification transistor ST2, and the output transistor ST3 is an N-type transistor or a P-type transistor. Hereinafter, a source, a drain, and a gate of the amplification transistor ST2 and the output transistor ST3 will be described based on a PMOS transistor, and a source, a drain, and a gate of the reset transistor ST1 will be described based on an NMOS transistor.

Of the reset transistor ST1, the amplification transistor ST2, and the output transistor ST3, the reset transistor ST1 is the same type of transistor as the third and fourth transistors T3 and T4 of the red pixel PX-R. The amplification transistor ST2 and the output transistor ST3 are the same type of transistor as the first, second, and fifth transistors T1, T2, and T5 and the first and second light emission control transistors ET1 and ET2 of the red pixel PX-R.

The circuit structure of the sensor driving circuit O_SD is not necessarily limited to that shown in FIG. 6A, and in other embodiments, the circuit structure of the sensor driving circuit O_SD changes in various ways.

The reset transistor ST1 include the source that receives a reset voltage Vrst, the drain connected to the first sensing node SN1, and the gate that receives a reset control signal RST. The reset transistor ST1 resets an electric potential of the first sensing node SN1 to the reset control signal RST in response to the reset control signal RST. The reset control signal RST is provided through the reset control line RCL, however, embodiments of the present disclosure are not necessarily limited thereto. Alternatively, in an embodiment, the reset control signal RST is the j-th compensation scan signal SCj received through the j-th compensation scan line SCLj. For example, the reset transistor ST1 receives the j-th compensation scan signal SCj through the j-th compensation scan line SCLj as the reset control signal RST. For example, the reset voltage Vrst has level that is less than that of the second driving voltage ELVSS at least during an activation period of the reset control signal RST. The reset voltage Vrst is a DC voltage maintained at a voltage level that is less than that of the second driving voltage ELVSS.

The amplification transistor ST2 includes the source that receives a sensing driving voltage SLVD, the drain connected to a second sensing node SN2, and the gate connected to the first sensing node SN1. The amplification transistor ST2 is turned on according to the electric potential of the first sensing node SN1 and applies the sensing driving voltage SLVD to the second sensing node SN2. For example, the sensing driving voltage SLVD is one of the first driving voltage ELVDD or the first or second initialization voltages VINT1 and VINT2. When the sensing driving voltage SLVD is the first driving voltage ELVDD, the source of the amplification transistor ST2 is electrically connected to the first driving voltage line VL1. When the sensing driving voltage SLVD is the first initialization voltage VINT1, the source of the amplification transistor ST2 is electrically connected to the first initialization voltage line VL3, and when the sensing driving voltage SLVD is the second initialization voltage VINT2, the source of the amplification transistor ST2 is electrically connected to the second initialization voltage line VL4.

The output transistor ST3 includes the source connected to the second sensing node SN2, the drain connected to the d-th read-out line RLd, and the gate that receives an output control signal. The output transistor ST3 applies a sensing signal FSd to the d-th read-out line RLd in response to the output control signal. The output control signal is the j-th write scan signal SWj received through the j-th write scan line SWLj. For example, the output transistor ST3 receives the j-th write scan signal SWj through the j-th write scan line SWLj as the output control signal.

The first and second optical sensing elements OPD1 and OPD2 of the sensor FX are exposed to light during the light emitting period of the light emitting elements ED_R, ED_G1, ED_G2, and ED_B (see FIG. 5A). The light is emitted from one of the light emitting elements ED_R, ED_G1, ED_G2, or ED_B.

When the user's hand US_F (see FIG. 1) touches the display surface IS (see FIG. 1), the optical sensing elements OPD1 and OPD2 generate photo-charges that correspond to the light reflected by ridges of the user's fingerprint or valleys between the ridges of the user's fingerprint, and the generated photo-charges accumulate in the first sensing node SN1. The amplification transistor ST2 is a source follower amplifier that generates a source-drain current in proportion to an amount of charge that the gate receives from the first sensing node SN1.

During the fourth activation period AP4 (see FIG. 6B), the low level j-th write scan signal SWj is applied to the output transistor ST3 through the j-th write scan line SWLj. When the output transistor ST3 is turned on in response to the low level j-th write scan signal SWj, a sensing signal FSd that corresponds to a current flowing through the amplification transistor ST2 is output to the d-th read-out line RLd.

Then, when the high level reset control signal RST is provided through the reset control line RCL during a reset period RSP (see FIG. 5C), the reset transistor ST1 is turned on. The reset period RSP is an activation period of the reset control line RCL, i.e., a high level period. Alternatively, when the reset transistor ST1 is a PMOS transistor, a low level reset control signal RST is applied to the reset control line RCL during the reset period RSP. During the reset period RSP, the first sensing node SN1 is reset to an electric potential that corresponds to the reset voltage Vrst. For example, the reset voltage Vrst has a level less than that of the second driving voltage ELVSS.

Then, when the reset period RSP ends, the first and second optical sensing elements OPD1 and OPD2 generate photo-charges that correspond to the light provided thereto, and the generated photo-charges accumulate in the first sensing node SN.

Figure 7:
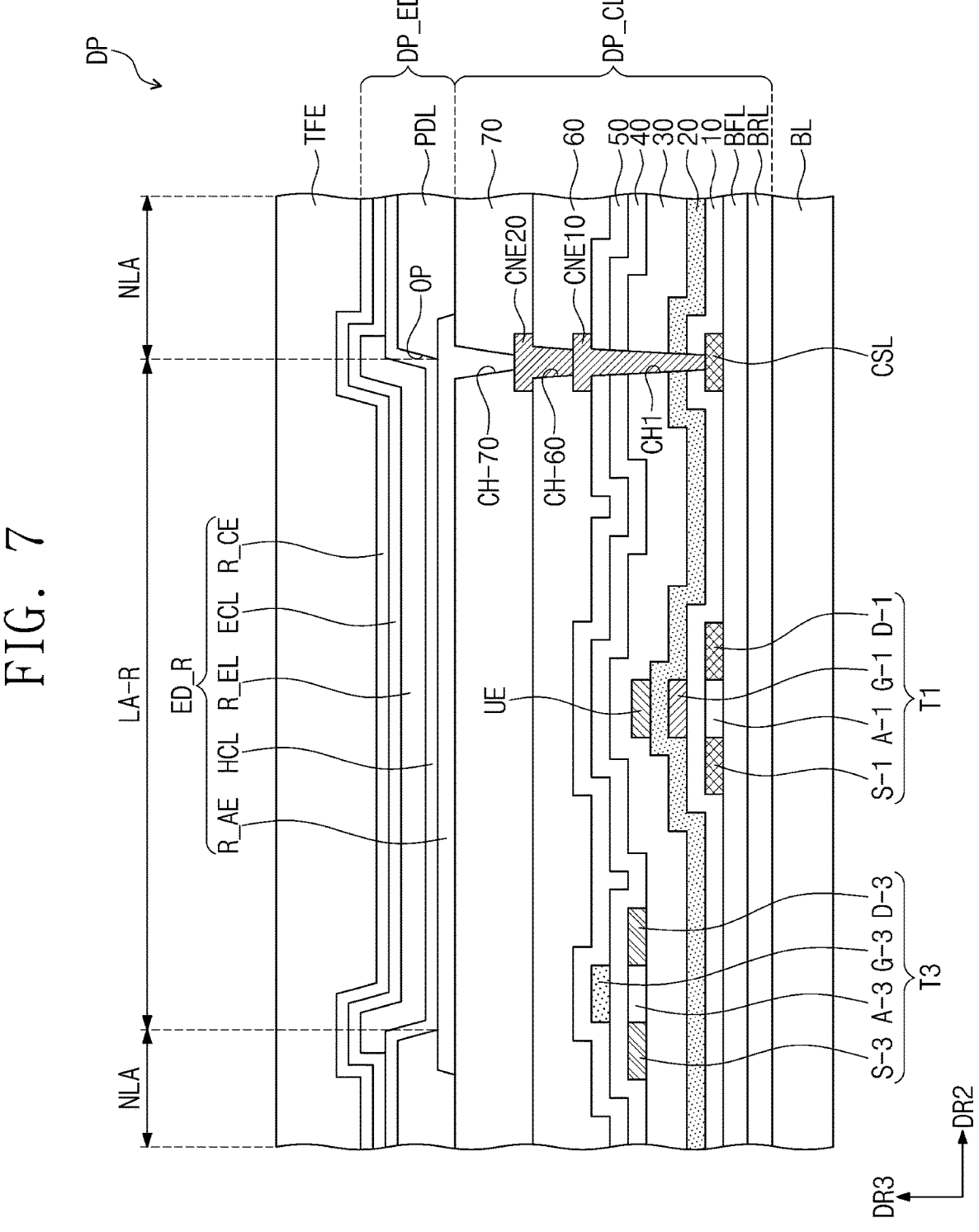
FIG. 7 is a cross-sectional view of a display panel according to an embodiment of the present disclosure.
Figure 8A:
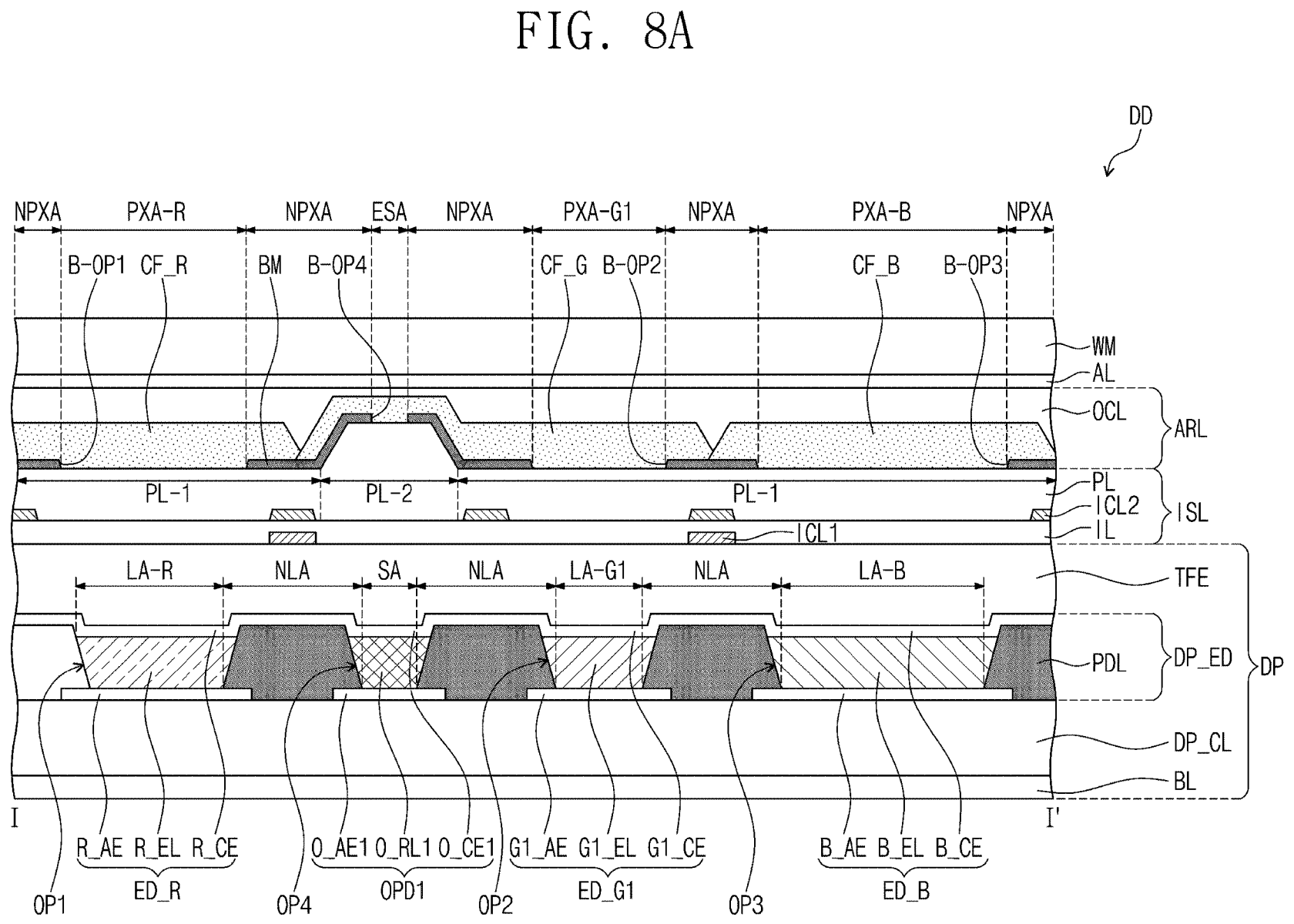
Figure 8B:
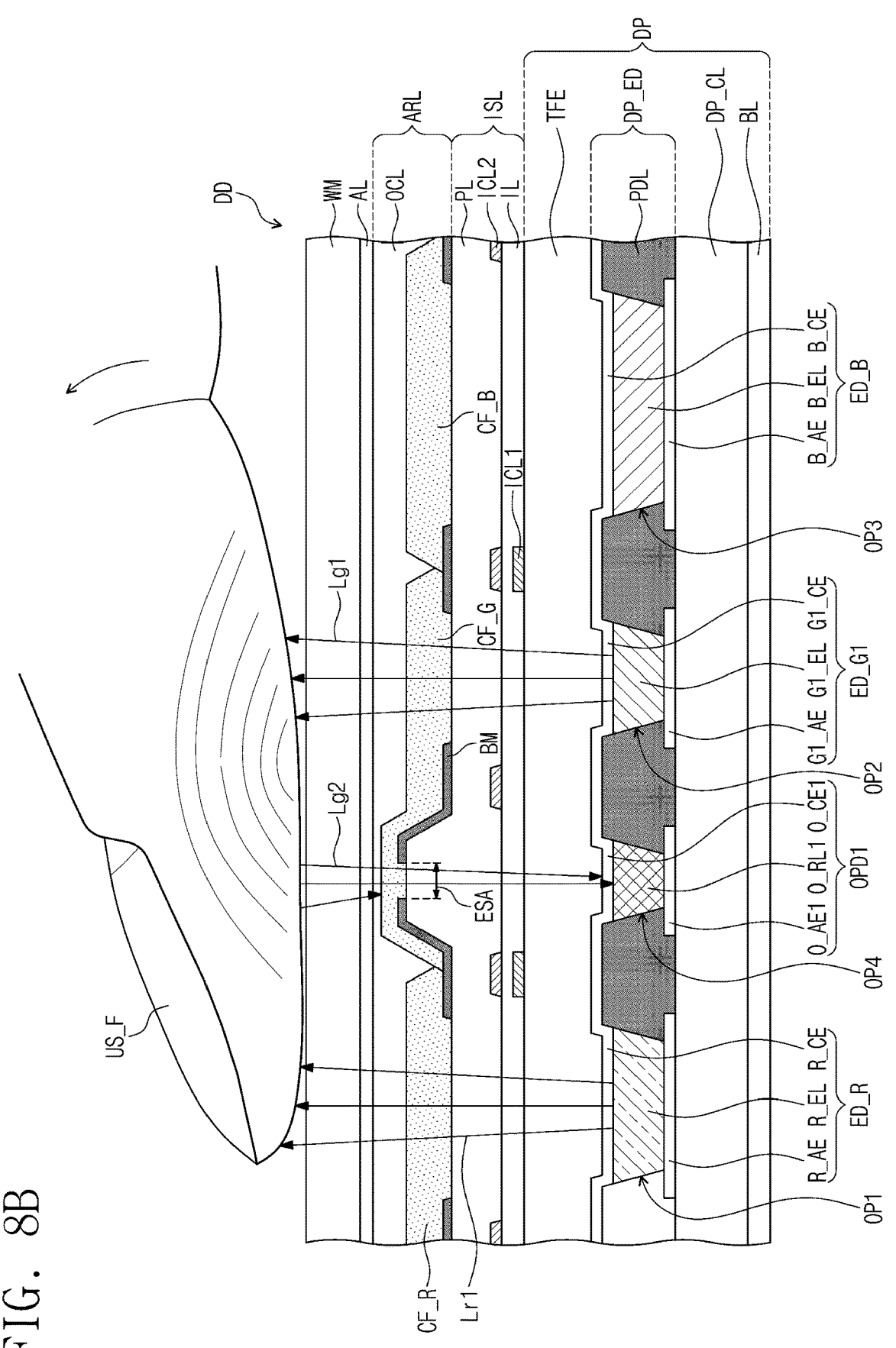

FIG. 7 is a cross-sectional view of the display panel DP according to an embodiment of the present disclosure. FIGS. 8A and 8B are cross-sectional views of the display device DP according to an embodiment of the present disclosure.

Referring to FIG. 7, in an embodiment, the display panel DP includes the base layer BL, the circuit layer DP_CL, the element layer DP_ED, and the thin film encapsulation layer TFE. The circuit layer DP_CL, the element layer DP_ED, and the thin film encapsulation layer TFE are sequentially disposed on the base layer BL.

The base layer BL includes a synthetic resin layer. The synthetic resin layer includes a heat-curable resin. In an embodiment, the synthetic resin layer includes a polyimide-based resin, however, a material for the synthetic resin layer is not necessarily limited thereto. In embodiments, the synthetic resin layer includes at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin. According to an embodiment, the base layer BL includes at least one of a glass substrate, a metal substrate, or an organic/inorganic composite material substrate.

The circuit layer DP_CL includes at least one inorganic layer, first to seventh insulating layers 10, 20, 30, 40, 50, 60 and 70, first and third transistors T1 and T3, and first and second connection electrodes CNE10 and CNE20. The least one inorganic layer is disposed on an upper surface of the base layer BL. The inorganic layer includes at least one of aluminum oxide, titanium oxide, silicon oxide, silicon nitride, silicon oxynitride, zirconium oxide, or hafnium oxide. The inorganic layer may include multiple layers. The inorganic layers form a barrier layer BRL and/or a buffer layer BFL. According to an embodiment, the buffer layer BFL and the barrier layer BRL are disposed on the base layer BL.

The barrier layer BRL prevents a foreign substance from entering from the outside. The barrier layer BRL includes a silicon oxide layer and a silicon nitride layer. According to an embodiment, the barrier layer BRL includes silicon oxide layers alternately stacked with silicon nitride layers.

The buffer layer BFL is disposed on the barrier layer BRL. The buffer layer BFL increases an adhesion between the base layer BL and a semiconductor pattern or between base layer BL and a conductive pattern. According to an embodiment, the buffer layer BFL includes a silicon oxide layer and a silicon nitride layer. The silicon oxide layer and the silicon nitride layer are alternately stacked one on another.

The semiconductor pattern is disposed directly on the buffer layer BFL. Hereinafter, the semiconductor pattern disposed directly on the buffer layer BFL is referred to as a first semiconductor pattern. The first semiconductor pattern includes a silicon semiconductor. The first semiconductor pattern includes polysilicon, however, embodiments are not necessarily limited thereto. According to an embodiment, the first semiconductor pattern includes amorphous silicon.

FIG. 7 shows only a portion of the first semiconductor pattern, and the first semiconductor pattern is further disposed in other areas. The first semiconductor pattern has different electrical properties depending on whether or not it is doped or whether it is doped with an N-type dopant or a P-type dopant. The first semiconductor pattern includes a doped region and a non-doped region. The doped region is doped with the N-type dopant or the P-type dopant. A P-type transistor includes a doped region doped with the P-type dopant, and an N-type transistor includes a doped region doped with the N-type dopant.

The doped region has a conductivity that is greater than that of the non-doped region, and serves as an electrode or a signal line. The non-doped region correspond to a channel area of the transistor. For example, a portion of the first semiconductor pattern is the channel area of the transistor, another portion of the first semiconductor pattern is the source or the drain of the transistor, and the other portion of the first semiconductor pattern is a connection electrode or a connection signal line.

As shown in FIG. 7, in an embodiment, a source S-1, a channel area A-1, and a drain D-1 of the first transistor T1 are formed from the first semiconductor pattern. The source S-1 and the drain D-1 extend in opposite directions from the channel area A-1.

FIG. 7 shows a portion of a signal transmission area CSL formed from the semiconductor pattern. The signal transmission area CSL is connected to the drain of the second light emission control transistor ET2 (see FIG. 6A) when viewed in a plan view.

A first insulating layer 10 is disposed on the buffer layer BFL. The first insulating layer 10 commonly overlaps the pixels PX (see FIG. 3) and covers the first semiconductor pattern. The first insulating layer 10 is an inorganic layer and/or an organic layer and may have a single-layer or a multi-layer structure. The first insulating layer 10 includes at least one of aluminum oxide, titanium oxide, silicon oxide, silicon oxynitride, zirconium oxide, or hafnium oxide. In an embodiment, the first insulating layer 10 has a single-layer structure of a silicon oxide layer. Not only the first insulating layer 10, but also an insulating layer of the circuit layer DP_CL described below is an inorganic layer and/or an organic layer and has a single-layer or a multi-layer structure. The inorganic layer includes at least one of the above-mentioned materials, however, it is not necessarily limited thereto.

A gate G-1 of the first transistor T1 is disposed on the first insulating layer 10. The gate G-1 is a portion of a metal pattern. The gate G-1 of the first transistor T1 overlaps the channel area A-1 of the first transistor T1. The gate G-1 of the first transistor T1 is used as a mask in a process of doping the first semiconductor pattern.

A second insulating layer 20 is disposed on the first insulating layer 10 and covers the gate G-1. The second insulating layer 20 commonly overlaps the pixels PX (see FIG. 3). The second insulating layer 20 is an inorganic layer and/or an organic layer and may have a single-layer or a multi-layer structure. In an embodiment, the second insulating layer has a single-layer structure of a silicon oxide layer.

An upper electrode UE is disposed on the second insulating layer 20. The upper electrode UE overlaps the gate G-1. The upper electrode UE is a portion of a metal pattern or a portion of the doped semiconductor pattern. A portion of the gate G-1 and the overlapping upper electrode UE form the capacitor Cst (see FIG. 6A). According to an embodiment, the upper electrode UE is omitted.

According to an embodiment, the second insulating layer 20 is replaced with an insulating pattern. The upper electrode UE is disposed on the insulating pattern. The upper electrode UE serves as a mask in a process of forming the insulating pattern from the second insulating layer 20.

A third insulating layer 30 is disposed on the second insulating layer 20 and covers the upper electrode UE. The third insulating layer 30 has a single-layer structure of a silicon oxide layer. Another semiconductor pattern is disposed directly on the third insulating layer 30. Hereinafter, the semiconductor pattern disposed directly on the third insulating layer is referred to as a second semiconductor pattern. The second semiconductor pattern includes a metal oxide. The oxide semiconductor includes a crystalline or amorphous oxide semiconductor. For example, the oxide semiconductor includes a metal oxide of a metal, such as zinc (Zn), indium (In), gallium (Ga), tin (Sn), titanium (Ti), etc., or a mixture of a metal, such as zinc (Zn), indium (In), gallium (Ga), tin (Sn), titanium (Ti), etc., and oxides thereof. The oxide semiconductor includes at least one of indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), zinc-tin oxide (ZTO), or the like.

FIG. 7 shows only a portion of the second semiconductor pattern, and the second semiconductor pattern is further disposed in other areas. The second semiconductor pattern includes a plurality of areas distinguished from each other by whether or not the metal oxide is reduced. An area, hereinafter referred to as a reduced area, where the metal oxide is reduced has a conductivity that is higher than that of an area, hereinafter referred to as a non-reduced area, where the metal oxide is not reduced. The reduced area substantially acts as an electrode or a signal line. The non-reduced area substantially corresponds to a channel of a transistor. For example, a portion of the second semiconductor pattern is a channel area of a transistor, and the other portion of the second semiconductor pattern is the source or the drain of the transistor.

Referring to FIG. 7, a source S-3, a channel area A-3, and a drain D-3 of the third transistor T3 are formed from the second semiconductor pattern. The source S-3 and the drain D-3 include a metal reduced from a metal oxide semiconductor. The source S-3 and the drain D-3 have a predetermined thickness from an upper surface of the second semiconductor pattern and include a metal layer that contains the reduced metal.

A fourth insulating layer 40 is disposed on the third insulating layer 30 and covers the second semiconductor pattern. In an embodiment, the fourth insulating layer 40 has a single-layer structure of a silicon oxide layer. A gate G-3 of the third transistor T3 is disposed on the fourth insulating layer 40. The gate G-3 is a portion of a metal pattern. The gate G-3 of the third transistor T3 overlaps the channel area A-3 of the third transistor T3.

According to an embodiment, the fourth insulating layer 40 is replaced with an insulating pattern. The gate G-3 of the third transistor T3 is disposed on the insulating pattern. In an embodiment, the gate G-3 has substantially the same shape as that of the insulating pattern when viewed in a plan view. For convenience of description, one gate G-3 is shown, however, in an embodiment, the third transistor T3 includes two gates.

A fifth insulating layer 50 is disposed on the fourth insulating layer 40 and covers the gate G-3. The fifth insulating layer 50 includes a silicon oxide layer and a silicon nitride layer. According to an embodiment, the fifth insulating layer 50 includes silicon oxide layers alternately stacked with silicon nitride layers.

The source and the drain of the fourth transistor T4 (see FIG. 6A) are formed through the same process as the source S-3 and the drain D-3 of the third transistor T3. In addition, the source and the drain of the reset transistor ST1 (see FIG. 6A) and the source and the drain of the output transistor ST3 (see FIG. 6A) of the sensor FX (see FIG. 6A) are substantially simultaneously formed through the same process as the source S-3 and the drain D-3 of the third transistor T3.

At least one insulating layer is further disposed on the fifth insulating layer 50. A sixth insulating layer 60 and a seventh insulating layer 70 are disposed on the fifth insulating layer 50. Each of the sixth insulating layer 60 and the seventh insulating layer 70 is an organic layer and has a single-layer or a multi-layer structure. In an embodiment, each of the sixth insulating layer 60 and the seventh insulating layer 70 has a single-layer structure of a polyimide-based resin layer, however, embodiments are not necessarily limited thereto. According to an embodiment, each of the sixth insulating layer 60 and the seventh insulating layer 70 includes at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin.

A first connection electrode CNE10 is disposed on the fifth insulating layer 50. The first connection electrode CNE10 is connected to the signal transmission area CSL through a first contact hole CH1 that penetrates through the first to fifth insulating layers 10 to 50, and a second connection electrode CNE20 that is connected to the first connection electrode CNE10 is formed through a contact hole CH-60 that penetrates through the sixth insulating layer 60. According to an embodiment of the present disclosure, at least one of the fifth, sixth, or seventh insulating layers 50, 60, and 70 is omitted.

The element layer DP_ED includes the red light emitting element ED_R and a pixel definition layer PDL. The first electrode R_AE of the red light emitting element ED_R is disposed on the seventh insulating layer 70. The first electrode R_AE of the red light emitting element ED_R is connected to the second connection electrode CNE20 through a contact hole CH-70 that penetrates through the seventh insulating layer 70.

At least a portion of the first electrode R_AE of the red light emitting element ED_R is exposed through an opening OP of the pixel definition layer PDL. The opening OP of the pixel definition layer PDL defines the red light emitting area LA-R. The red light emitting area LA-R corresponds to the exposed portion of the first electrode R_AE, and the non-light-emitting area NLA is adjacent to the red light emitting area LA-R.

A hole control layer HCL is commonly disposed on the light emitting area LA-R and the non-light-emitting area NLA. A common layer such as the hole control layer HCL is commonly formed in the pixels PX. The hole control layer HCL includes a hole transport layer and a hole injection layer.

The red light emitting layer R_EL is disposed on the hole control layer HCL. The red light emitting layer R_EL is disposed only in an area that corresponds to the opening OP. The red light emitting layer R_EL is formed in each of the pixels PX after being divided into a plurality of portions.

In an embodiment, a patterned red light emitting layer R_EL is shown as a representative example, however, embodiments of the present disclosure are not necessarily limited thereto. In an embodiment, a common light emitting layer is commonly disposed in the pixels PX. The common light emitting layer generates a white light or a blue light.

An electron control layer ECL is disposed on the red light emitting layer R_EL. The electron control layer ECL includes an electron transport layer and an electron injection layer. The second electrode R_CE of the red light emitting element ED_R is disposed on the electron control layer ECL. The electron control layer ECL and the second electrode R_CE are commonly disposed in the pixels PX.

The thin film encapsulation layer TFE is disposed on the second electrode R_CE. The thin film encapsulation layer TFE covers the plurality of pixels PX. According to an embodiment, the thin film encapsulation layer TFE directly covers the second electrode R_CE. According to an embodiment, the display panel DP further includes a capping layer that directly covers the second electrode R_CE. According to an embodiment, the red light emitting element ED_R has a stacked structure that is vertically inverted (upside down) compared with the structure shown in FIG. 7.

FIGS. 8A and 8B are cross-sectional views of the display device DD taken along a line I-I' of FIGS. 4 and 5A. Since the circuit layer DP_CL is the same as that described with reference to FIG. 7, the circuit layer DP_CL is simply illustrated in FIGS. 8A and 8B. First, second, and third openings OP1, OP2, and OP3 of the pixel definition layer PDL respectively expose at least portions of the first electrodes R_AE, G_AE1, and B_AE of the red, green, blue light emitting elements ED_R, ED_G1, and ED_B. In addition, a fourth opening OP4 of the pixel definition layer PDL exposes at least a portion of the first electrode O_AE1 of the first optical sensing element OPD1. The portion of the first electrode O_AE1 exposed through the fourth opening OP4 is the sensing area SA.

According to an embodiment, the pixel definition layer PDL further includes a black material. For example, the pixel definition layer PDL further includes a black organic dye/pigment, such as a carbon black or an aniline black. The pixel definition layer PDL is formed by mixing a blue organic material with a black organic material. The pixel definition layer PDL further includes a liquid-repellent organic material.

As shown in FIG. 8A, the non-light-emitting area NLA is adjacent to the red, green, and blue light emitting areas LA-R, LA-G1, and LA-B and the sensing area SA. The non-light-emitting area NLA corresponds to the pixel definition layer PDL. The red, green, and blue light emitting layers R_EL, G1_EL, and B_EL are respectively disposed on the first electrodes R_AE, G_AE1, and B_AE of the red, green, and blue light emitting elements ED_R, ED_G1, and ED_B. In an embodiment, the patterned red, green, and blue light emitting layers R_EL, G1_EL, and B_EL are shown as a representative example, however, embodiments are not necessarily; limited thereto. In an embodiment, one light emitting layer is commonly disposed in the red, green and blue light emitting areas LA-R, LA-G1, and LA-B and the non-light-emitting area NLA. The light emitting layer may generate a white light or a blue light. In addition, the light emitting layer may have a multi-layer structure that is called a tandem.

According to an embodiment, each of the red, green, and blue light emitting layers R_EL, G1_EL, and B_EL includes an organic material as the light emitting material. According to an embodiment, each of the red, green, and blue light emitting layers R_EL, G1_EL, and B_EL includes a quantum dot as the light emitting material. A core of the quantum dot is one of a group II-VI compound, a group III-V compound, a group IV-VI compound, a group IV element, a group IV compound, or combinations thereof.

The photoelectric conversion layer O_RL1 is disposed on the first electrode O_AE1 of the first optical sensing element OPD1. The photoelectric conversion layer O_RL1 includes an organic photo-sensing material, such as a photosensitive semiconductor material. A second electrode layer is commonly disposed on the red, green, and blue light emitting layers R_EL, G1_EL, and B_EL and the photoelectric conversion layer O_RL1. The second electrode layer includes second electrodes R_CE, G_CE1, and B. CE of the red, green, and blue light emitting elements ED_R, ED_G1, and ED_B and a second electrode O_CE1 of the first optical sensing element OPD1.

Accordingly, a predetermined electric field can be formed between the first and second electrodes O_AE1 and O_CE1 of the first optical sensing element OPD1. The photoelectric conversion layer O_RL1 generates an electrical signal that corresponds to light incident thereto. The photoelectric conversion layer O_RL1 absorbs energy of the light incident thereto and generates electric charges.

The electric charges generated by the photoelectric conversion layer O_RL1 change the electric field formed between the first electrode O_AE1 and the second electrode O_CE1. The amount of electric charges generated by the photoelectric conversion layer O_RL1 changes depending on whether the light is incident into the first optical sensing element OPD1 and the amount and the intensity of the light incident into the first optical sensing element OPD1. Accordingly, the electric field fonned between the first electrode O_AE1 and the second electrode O_CE1 can change. The first optical sensing element OPD1 according to an embodiment obtains fingerprint information of a user based on the change in electric field between the first electrode O_AE1 and the second electrode O_CE1.

However, embodiments are not necessarily limited thereto, and in an embodiment, the first optical sensing element OPD1 includes a phototransistor that uses the photoelectric conversion layer O_RL1 as its active layer. For example, the first optical sensing element OPD1 senses an amount of current that flows through the phototransistor and obtains the fingerprint information. According to an embodiment, the first optical sensing element OPD1 includes various photoelectric conversion elements that generate an electrical signal in response to a change in amount of the light, but embodiments are not necessarily limited thereto.

The thin film encapsulation layer TFE is disposed on the element layer DP_ED. The thin film encapsulation layer TFE includes at least an inorganic layer or an organic layer. According to an embodiment, the thin film encapsulation layer TFE includes two inorganic layers and an organic layer disposed between the inorganic layers. According to an embodiment, the thin film encapsulation layer includes a plurality of inorganic layers and a plurality of organic layers alternately stacked with the inorganic layers.

The input sensing layer ISL is disposed on the thin film encapsulation layer TFE, and the anti-reflective layer ARL is disposed on the input sensing layer ISL.

The input sensing layer ISL is disposed directly on the thin film encapsulation layer TFE. The input sensing layer ISL includes a first conductive layer ICL1, a first insulating layer IL, a second conductive layer ICL2, and a second insulating layer PL. In an embodiment, the first conductive layer ICL1 is disposed directly on the thin film encapsulation layer TFE. FIGS. 8A to 8B show a structure in which the first conductive layer ICL1 is disposed directly on the thin film encapsulation layer TFE, however, embodiments of the present disclosure are not necessarily limited thereto. In an embodiment, the input sensing layer ISL further includes a base insulating layer disposed between the first conductive layer ICL1 and the thin film encapsulation layer TFE. For example, the thin film encapsulation layer TFE is covered by the base insulating layer, and the first conductive layer ICL1 is disposed on the base insulating layer. For example, the base insulating layer includes an inorganic layer.

The first insulating layer IL is disposed on the thin film encapsulation layer TFE and covers the first conductive layer ICL1. In an embodiment, the first insulating layer IL is disposed directly on the thin film encapsulation layer TFE. The first insulating layer IL includes an inorganic layer. The second conductive layer ICL2 is disposed on the first insulating layer IL. The first and second conductive layers ICL1 and ICL2 include a plurality of conductive patterns. The conductive patterns form an input sensing electrode. The second conductive layer ICL2 includes two types of input sensing electrodes, and the first conductive layer ICL1 corresponds to a bridge pattern that connects input sensing electrodes of one of the two types of input sensing electrodes. Sensor patterns are connected to the bridge pattern through a contact hole formed through the first insulating layer IL.

In an embodiment, the input sensing layer ISL includes the first and second conductive layers ICL1 and ICL2, however, embodiments of the present disclosure are not necessarily limited thereto. According to an embodiment, the input sensing layer ISL includes only one of the first and second conductive layers ICL1 and ICL2.

The second insulating layer PL is disposed on the second conductive layer ICL2 and covers the second conductive layer ICL2. The second insulating layer PL includes an organic insulating material. The second insulating layer PL protects the first and second conductive layers ICL1 and ICL2 from moisture and oxygen and also protects the first and second conductive layers ICL1 and ICL2 from a foreign substance.

The second insulating layer PL includes a first area PL-1 and a second area PL-2 that are distinguished from each other by their thicknesses. The second area PL-2 has a thickness that is greater than that of the first area PL-1. An area corresponding to the first area PL-1 or an area corresponding to the second area PL-2 is selectively exposed using a halftone mask after the insulating layer is formed, and thus, the thickness of the area corresponding to the first area PL-1 is reduced.

The first area PL-1 provides a substantially flat upper surface. The first area PL-1 overlaps the red, green, and blue light emitting areas LA-R, LA-G1, and LA-B and the non-light-emitting area NLA adjacent to the red, green, and blue light emitting areas LA-R, LA-G1, and LA-B.

The second area PL-2 overlaps at least the sensing area SA. The second area PL-2 further overlaps at least portions of the non-light-emitting area NLA adjacent to the sensing area SA. The second area PL-2 allows the light blocking pattern BM to be disposed away from the first optical sensing element OPD1, which increases a resolution of the detected fingerprint. The second area PL-2 will be described in detail below.

In addition, when the thickness of the second insulating layer PL is increased, the light blocking pattern BM disposed in the first area PL-1 is disposed away from the light emitting elements ED_R, ED_G1, ED_G2, and ED_B, and thus, an emission angle of the red light, the green light, and the blue light that is respectively emitted from the light emitting elements ED_R, ED_G1, ED_G2, and ED_B is reduced. The narrowing of the emission angle of the source light narrows a viewing angle of the image.

The anti-reflective layer ARL is disposed directly on the second insulating layer PL. The anti-reflective layer ARL includes the light blocking pattern BM. The light blocking pattern BM corresponds to the non-light-emitting area NLA. The light blocking pattern BM includes a black material. For example, the light blocking pattern BM includes a black organic dye/pigment, such as a carbon black or an aniline black.

First, second, third, and fourth openings B-OP1, B-OP2, B-OP3, and B-OP4 are formed through the light blocking pattern BM and respectively correspond to the first, second, third, and fourth openings OP1, OP2, OP3, and OP4 of the pixel definition layer PDL. The first, second, and third openings B-OP1, B-OP2, and B-OP3 of the light blocking pattern BM define a red pixel area PXA-R, a green pixel area PXA-G1, and a blue pixel area PXA-B, respectively. The light blocking pattern BM defines a non-pixel area NPXA.

The light blocking pattern BM overlaps the first and second conductive layers ICL1 and ICL2 in the non-pixel area NPXA.

The red light, the green light, and the blue light propagate out through the red pixel area PXA-R, the green pixel area PXA-G1, and the blue pixel area PXA-B, respectively. Each of the red pixel area PXA-R, the green pixel area PXA-G1, and the blue pixel area PXA-B has a size greater than that of a corresponding opening of the first, second, and third openings B-OP1, B-OP2, and B-OP3 to increase a light emitting efficiency.

The fourth opening B-OP4 of the light blocking pattern BM defines an effective sensing area ESA. The effective sensing area ESA has a size that is smaller than a size of the sensing area SA. This will be described in detail below.

The anti-reflective layer ARL further includes a first color filter CF_R, a second color filter CF_G, and a third color filter CF_B. The first color filter CF_R has a first color, the second color filter CF_G has a second color, and the third color filter CF_B has a third color. Hereinafter, the first color filter CF_R, the second color filter CF_G, and the third color filter CF_B are referred to as a red color filter CF_R, a green color filter CF_G, and a blue color filter CF_B.

The red color filter CF_R, the green color filter CF_G, and the blue color filter CF_B respectively overlap the red light emitting area LA-R, the green light emitting area LA-G1, and the blue light emitting area LA-B. A portion of each of the red color filter CF_R, the green color filter CF_G, and the blue color filter CF_B overlaps the non-light-emitting area NLA.

One of the red color filter CF_R, the green color filter CF_G, or the blue color filter CF_B further overlaps the sensing area SA. According to an embodiment, the green color filter CF_G overlaps the sensing area SA. The green color filter CF_G covers the effective sensing area ESA. The green color filter CF_G overlaps the second area PL-2 of the second insulating layer PL.

The green color filter CF_G that overlaps the green light emitting area LA-G1 is integrally provided with the green color filter CF_G that overlaps the sensing area SA, however, embodiments are not necessarily limited thereto.

The anti-reflective layer ARL further includes an overcoat layer OCL. The overcoat layer OCL includes an organic insulating material. The overcoat layer OCL is sufficiently thick to compensate a step difference between the red, green, and blue color filters CF_R, CF_G, and CF_B due to the thickness differences of the first area PL-1 and the second area PL-2 of the second insulating layer PL.

The overcoat layer OCL planarizes an upper surface of the anti-reflective layer ARL. The planarization of the upper surface of the anti-reflective layer ARL is a relative concept, and it is sufficient that the overcoat layer OCL provide an upper surface that is flatter than the upper surface of the second insulating layer PL. In particular, a step difference in the green color filter CF_G is caused by the step difference between the first area PL-1 and the second area PL-2 of the second insulating layer PL, and the step difference in the green color filter CF_G is compensated for by the overcoat layer OCL.

Referring to FIG. 8B, in an embodiment, when the display device DD operates, each of the red, green, and blue light emitting elements ED_R, ED_G1, and ED_B can emit light. The red light emitting elements ED_R emit red light in a red wavelength band, the green light emitting elements ED_G1 emit green light in a green wavelength band, and the blue light emitting elements ED_B emit blue light in a blue wavelength band.

The first optical sensing element OPD1 receives light only in a specific wavelength due to the color filter disposed on the first optical sensing element OPD1. According to an embodiment, the first optical sensing element OPD1 receives a reflected green light Lg2. The reflected green light Lg2 is a light obtained when a green light Lg1 emitted from the green light emitting elements ED_G1 is reflected by the user's fingerprint. Meanwhile, the red and blue light respectively emitted from the red and blue light emitting elements ED_R and ED_B are also reflected by the user's hand US_F, however, they are blocked by the green color filter CF_G.

Figure 9A:
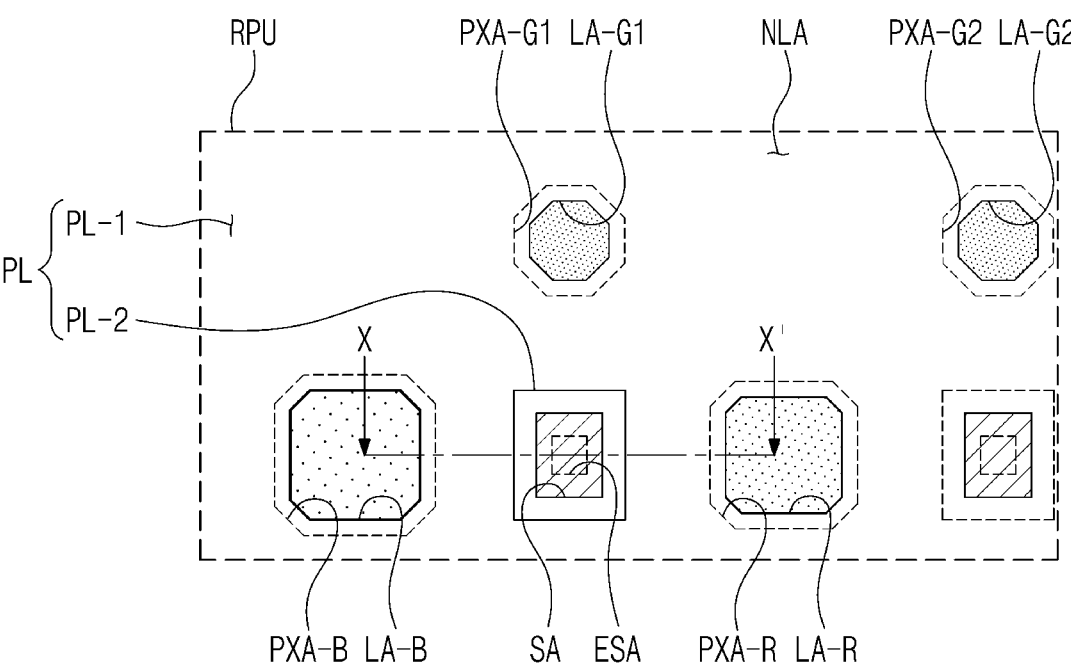
FIG. 9A is a plan view of an arrangement relationship between a second insulating layer and a sensing area according to an embodiment of the present disclosure.
Figure 9A:
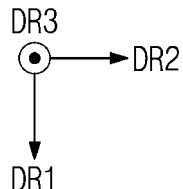
Figure 9B:
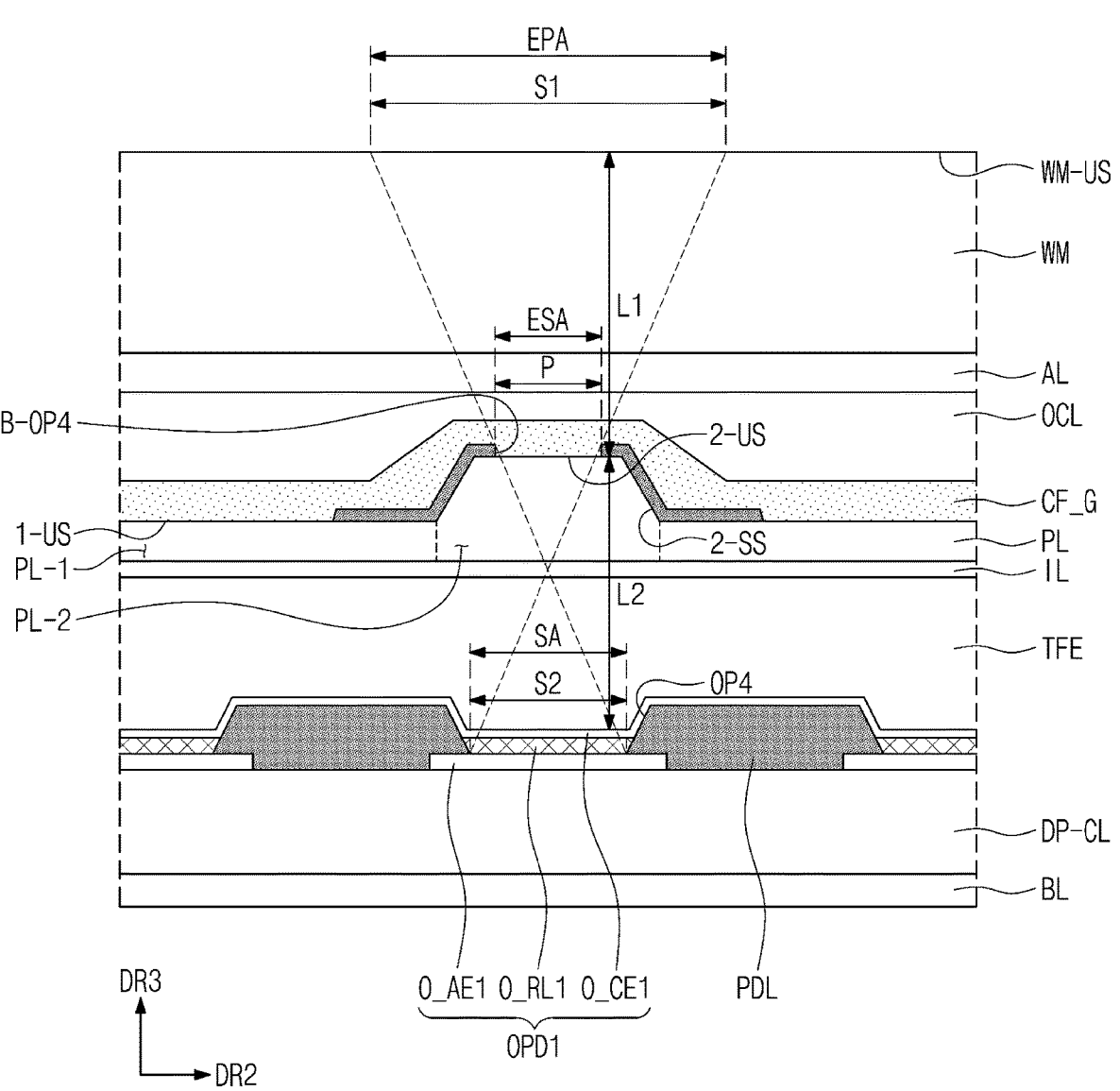
FIG. 9B is a cross-sectional view of a display device taken along a line X-X' of FIG. 9A.
Figure 10A:
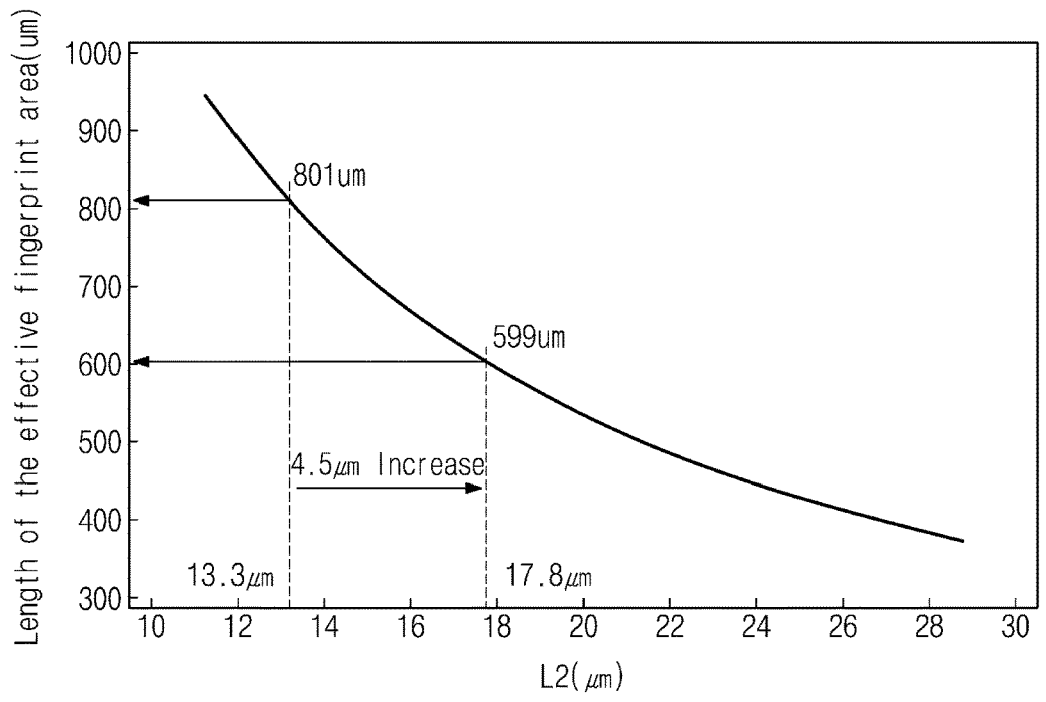
FIG. 10A is a graph of a relationship between an effective fingerprint area and a distance between a light blocking pattern and an optical sensing element.

FIG. 9A is a plan view of an arrangement relationship between the second insulating layer PL and the sensing area SA according to an embodiment of the present disclosure. FIG. 9B is a cross-sectional view of a display device taken along a line X-X' of FIG. 9A. FIG. 10A is a graph of a relationship between an effective fingerprint area EPA and a distance between a light blocking pattern and an optical sensing element. FIG. 101 is a graph of a relationship between the effective fingerprint area EPA and a distance between the light blocking pattern and an upper surface of the window.

According to an embodiment, FIG. 9A shows one unit area RPU. When viewed in a plan view, the red light emitting area LA-R, the green light emitting area LA-G1, and the blue light emitting area LA-B are disposed inside the red pixel area PXA-R, the green pixel area PXA-G1, and the blue pixel area PXA-B, respectively. Referring to FIGS. 8A and 9A, in an embodiment, the first, second, and third openings OP1, OP2, and OP3 of the pixel definition layer PDL are formed inside the first, second, and third openings B-OP1, B-OP2, and B-OP3 of the light blocking pattern BM, respectively, when viewed in a plan view.

When viewed in a plan view, the effective sensing area ESA is located inside the sensing area SA. Referring to FIGS. 8A and 9A, in an embodiment, when viewed in a plan view, the fourth opening B-OP4 of the light blocking pattern BM is formed inside the first optical sensing element OPD1.

The first area PL-1 of the second insulating layer PL of the input sensing layer ISL overlaps the red, green, and blue light emitting areas LA-R, LA-G1, and LA-B and the non-light-emitting area NLA adjacent to the red, green, and blue light emitting areas LA-R, LA-G1, and LA-B. The second area PL-2 of the second insulating layer PL of the input sensing layer ISL overlaps the effective sensing area ESA and the sensing area SA.

FIG. 9B is an enlarged cross-sectional view taken along a line X-X' of FIG. 9A and corresponds to a portion of FIG. 8A. Referring to FIGS. 9A and 9B, in an embodiment, the second area PL-2 includes a slanted surface 2-SS that extends upward from an upper surface 1-US of the first area PL-1, and an upper surface 2-US that extends from the slanted surface 2-SS and corresponds to the sensing area SA or the optical sensing element OPD1. FIG. 9B shows a linear slanted surface 2-SS when viewed in cross-section, however, embodiments of the present disclosure are not necessarily limited thereto. The slope and shape of the slanted surface 2-SS can vary depending on an exposure performance of the halftone mask and an etching performance of the insulating layer.

The effective fingerprint area EPA is defined in the upper surface of the window WM and corresponds to one optical sensing element OPD1. The effective fingerprint area EPA is where an effective reflected green light Lg2 that can reach the optical sensing element OPD1 after passing through the effective sensing area ESA (FIG. 8B) is generated or reflected when a user's finger touches the upper surface of the window WM. The reflected green light Lg2 includes information about the fingerprint, such as information about ridges or valleys between the ridges. The green light Lg2 reflected from an area outside the effective fingerprint area EPA does not pass through the effective sensing area ESA, and as a result, the optical sensing element OPD1 obtains information only about the fingerprint that overlaps the effective fingerprint area EPA.

When the effective fingerprint area EPA is longer than a reference value in a reference direction, the ridges or the valleys are disposed in the effective fingerprint area EPA. Thus, the optical sensing element OPD1 might not be able to identify which of a ridge or a valley is disposed in the effective fingerprint area EPA.

A pitch of a standard fingerprint, such as a length between ridges or a length between valleys, is about 416 um, and thus, a length of the effective fingerprint area EPA should be is equal to or less than about 500 um. The length of the effective fingerprint area EPA should be less than about 416 um, and the length of the effective fingerprint area EPA may be equal to or less than about 400 um, about 300 um, or about 200 m. The ridge or valley information is obtained from one effective fingerprint area EPA, and the fingerprint information about the finger that touches the window WM is completed based on the ridge or valley information that is obtained from a plurality of effective fingerprint areas EPA.

In the reference direction, a length S1 of the effective fingerprint area EPA can be determined by the following Equation 1.

$$S1 = P + \frac{L1}{L2}(P + S2), \qquad \text{Equation 1}$$

In Equation 1, P denotes a length of the fourth opening B-OP4 of the light blocking pattern BM in the reference direction, S2 denotes a length of the sensing area SA of the optical sensing element OPD1 in the reference direction, L1 denotes a distance between the upper surface 2-US of the second area PL-2 and the upper surface WM-US of the window WM in the thickness direction DR3 of the display device DD, and L2 denotes a distance between the upper surface 2-US of the second area PL-2 and the optical sensing element OPD1 in the thickness direction DR3 of the display device DD. L1 denotes a distance between the light blocking pattern BM disposed on the second area PL-2 and the upper surface WM-US of the window WM in the thickness direction DR3 of the display device DD.

Referring to FIG. 9B, in an embodiment, the second area PL-2 increases the distance L2 between the upper surfaces 1-US, 2-US of the second insulating layer PL and the optical sensing element OPD1, and as a result, the length S1 of the effective fingerprint area EPA decreases. The length S1 of the effective fingerprint area EPA can be decreased by decreasing the distance L1 between the upper surface 2-US of the second area PL-2 and the upper surface WM-US of the window WM, by decreasing a length P of the fourth opening B-OP4 of the light blocking pattern BM, or by decreasing the length S2 of the sensing area SA of the optical sensing element OPD1. However, these cases are less efficient compared with the case of increasing the distance L2 between the upper surface 2-US of the second area PL-2 and the optical sensing element OPD1 due to the following reasons.

Decreasing the length P of the fourth opening B-OP4 of the light blocking pattern BM or decreasing the length S2 of the sensing area SA of the optical sensing element OPD1 reduces a magnitude of an amount of the light that reaches the optical sensing element OPD1, and thus, a difference in light amount between the reflected green light Lg2 that includes the ridge information and the reflected green light Lg2 that includes valley information. This may have a low a signal-to-noise ratio (SNR).

In addition, as the length P of the fourth opening B-OP4 decreases, a difference between the fourth openings B-OP4 increases. This is because a process deviation can occur that depends on areas during a process of patterning the light blocking pattern BM. Due to the process deviation, the length P of the fourth opening B-OP4 is about 6 μm to about 10 μm.

Figure 10B:
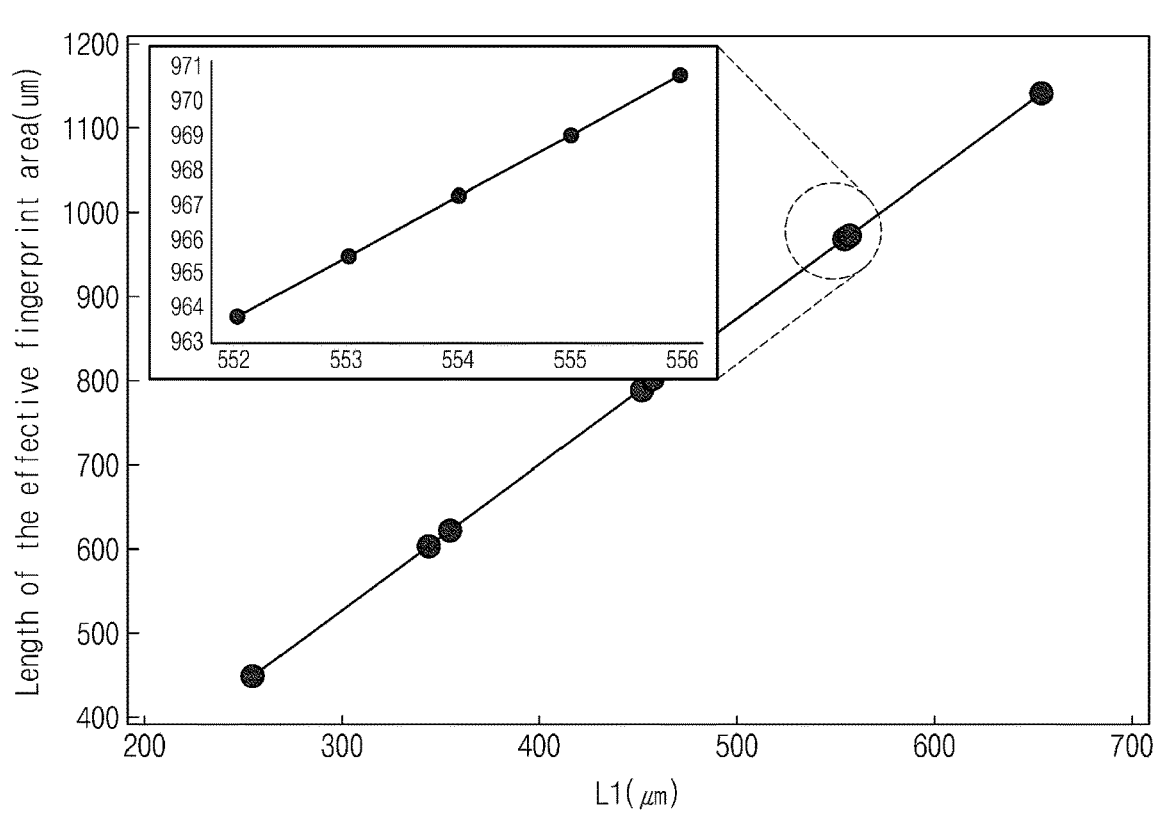
FIG. 10B is a graph of a relationship between an effective fingerprint area and a distance between a light blocking pattern and an upper surface of a window, according to an embodiment of the present disclosure.

FIG. 10A is a graph of the length of the effective fingerprint area EPA as a function of a change of the distance L2. FIG. 10B is a graph of the length of the effective fingerprint area EPA as a function of a change of the distance L1. A display device of which L1, L2, P. and S2 in Equation 1 respectively correspond to 555 μm, 9.8 μm, 6 μm, and 11 μm is used as a representative example.

Referring to the graph of FIG. 10A, in an embodiment, as L2 increases by about 1□, the length of the effective fingerprint area EPA decreases by about 44.9□, and as L2 decreases by about 1□, the length of the effective fingerprint area EPA increases by about 44.9□. Referring to the graph of FIG. 10B, in an embodiment, as L1 decreases by about 1□, the length of the effective fingerprint area EPA decreases by about 1.7□, and as L1 increases by about 1□, the length of the effective fingerprint area EPA increases by about 1.7□. When L1 and L2 equally change by about 1 μm, a rate at which the length of the effective fingerprint area EPA changes with respect to L1 and a rate at which the length of the effective fingerprint area EPA changes with respect to L2 are very different. According to an embodiment, since the sum of L1 and L2 is constant, when L1 increases, L2 decreases, and when L2 increases, L1 decreases. Consequently, when L1 and L2 have the same length, it is more effective to increase the distance L2 by reducing the length S1 of the effective fingerprint area EPA.

In addition, the second insulating layer PL of the input sensing layer ISL has been described as the insulating layer that provides the structure that increases the distance between the light blocking pattern BM disposed on the optical sensing element OPD1 and the optical sensing element OPD1, however, embodiments of the present disclosure are not necessarily limited thereto. Any insulating layer disposed between the optical sensing element OPD1 and the light blocking pattern BM and that has a thickness that varies depending on areas can function as the second insulating layer PL of the input sensing layer ISL as described above.

FIG. 11 is a cross-sectional view of a display device DD according to an embodiment of the present disclosure. FIG. 11 shows a cross-section that corresponds to that of FIG. 8A. In FIG. 11, the same reference numerals may denote the same elements in FIGS. 1 to 10B, and thus, detailed descriptions of the same elements will be omitted.

According to an embodiment, a second insulating layer PL of an input sensing layer ISL has a uniform thickness regardless of areas thereof. The second insulating layer PL of the input sensing layer ISL provides a flat upper surface.

An insulating pattern IP is disposed on the second insulating layer PL. In an embodiment, the insulating pattern IP corresponds to the second area PL-2 of the second insulating layer PL of FIG. 8A. The insulating pattern IP is formed using a mask pattern after an additional insulating layer is formed on the second insulating layer PL.

Different from the thickness of the second area PL-2 of the second insulating layer PL of FIGS. 8A and 9B, which is determined by the exposure performance of a halftone mask, the thickness of the insulating pattern IP can be set in various ways, since a halftone mask is not used in a process of forming the insulating pattern IP. The thickness of the insulating pattern IP is greater than the thickness of the second insulating layer PL.

The insulating pattern IP may have a single-layer or a multi-layer structure, and the insulating pattern IP includes at least one of an organic layer or an inorganic layer. The insulating pattern IP may include the same material as the second insulating layer PL or may include a different material from the second insulating layer PL.

Although embodiments of the present disclosure have been described, it is understood that embodiments of the present disclosure are not limited to these embodiments but various changes and modifications can be made by one ordinary skilled in the art within the spirit and scope of the present disclosure as hereinafter claimed.

What is claimed is:

1. An electronic device, comprising:
a display module; and
a window disposed on the display module,
wherein the display module comprises:
  a base layer;
  a light emitting element disposed on the base layer;
  an optical sensing element disposed on the base layer;
  a thin film encapsulation layer that covers the light emitting element and the optical sensing element;
  an insulating layer disposed on the thin film encapsulation layer and that includes a first area that overlaps the light emitting element and a second area that overlaps the optical sensing element, wherein the insulating layer has a thickness in the second area that is greater than a thickness in the first area;
  a light blocking pattern disposed on the insulating layer and that includes a first opening that corresponds to the light emitting element and a second opening that corresponds to the optical sensing element; and
  a color filter disposed on the insulating layer and the light blocking pattern, and that overlaps the second opening,
  wherein a color filter that overlaps the second area protrudes further in a direction opposite to the insulating layer and the light blocking pattern than a color filter that overlaps the first area with respect to the color filter.

2. The electronic device of claim 1, wherein a length (S1) of an effective fingerprint area is determined by the following Equation 1 of $$S1 = P + \frac{L1}{L2}(P + S2)$$

in a reference direction, wherein
  P denotes a length in the reference direction of the second opening,
  S2 denotes a length in the reference direction of a sensing area of the optical sensing element,
  L1 denotes a distance in a thickness direction of the display device between an upper surface of the second area and an upper surface of the window, and L2 denotes a distance in the thickness direction of the display device between the upper surface of the second area and the optical sensing element.

3. The electronic device of claim 2, wherein the length (S1) of the effective fingerprint area is equal to or less than about 500 micrometers.

4. The electronic device of claim 2, wherein the length (P) of the second opening in the reference direction is within a range from about 6 micrometers to about 10 micrometers.

5. The electronic device of claim 2, wherein the optical sensing element comprises:
  a first electrode of which at least a portion is exposed without being covered by a pixel definition layer;
  a photoelectric conversion layer disposed on the first electrode; and
  a second electrode disposed on the photoelectric conversion layer, wherein a length in the reference direction of a sensing area of the optical sensing element is a length in the reference direction of the portion of the first electrode exposed without being covered by the pixel definition layer.

6. The electronic device of claim 1, wherein the second area comprises:
  a slanted surface that extends upward from an upper surface of the first area; and
  an upper surface that extends from the slanted surface and that corresponds to an upper surface of the optical sensing element.

7. The electronic device of claim 1,
  wherein the light emitting element comprises first color light emitting elements, second color light emitting elements, and third color light emitting elements,
  wherein one first color light emitting element, two second color light emitting elements, and one third color light emitting element form a unit light emitting element, and two optical sensing elements are disposed in the unit light emitting element.

8. The electronic device of claim 7, wherein the two optical sensing elements are electrically connected to each other.

9. The electronic device of claim 1, wherein
  the light emitting element comprises first color light emitting elements, second color light emitting elements, and third color light emitting elements, and
  the optical sensing element is disposed at a center between the first color light emitting element and the third color light emitting element in a second direction and a center between two second color light emitting elements in a first direction that crosses the second direction.

10. The electronic device of claim 1, wherein the display module further comprises
  a pixel definition layer that includes a first opening formed therethrough that exposes a first electrode of the light emitting element and a second opening formed therethrough that exposes a first electrode of the optical sensing element, wherein
  the first opening of the pixel definition layer is disposed inside the first opening of the light blocking pattern when viewed in a plan view, and
  the second opening of the light blocking pattern is disposed inside the second opening of the pixel definition layer when viewed in a plan view.

11. The electronic device of claim 1, wherein the display module further comprises an overcoat layer disposed on the insulating layer and that covers the light blocking pattern and the color filter, wherein the overcoat layer provides an upper surface that is flatter than an upper surface of the insulating layer.

12. The electronic device of claim 1, wherein the display module further comprises:

at least one inorganic layer disposed between the thin film encapsulation layer and the insulating layer; and a touch sensing electrode disposed between the thin film encapsulation layer and the insulating layer.

13. A display device, comprising:

a display module; and a window disposed on the display module, wherein the display module comprises:

a base layer;

a light emitting element disposed on the base layer;

an optical sensing element disposed on the base layer;

a thin film encapsulation layer that covers the light emitting element and the optical sensing element;

an insulating layer disposed on the thin film encapsulation layer;

an insulating pattern disposed on the insulating layer and that overlaps the optical sensing element;

a light blocking pattern disposed on the insulating layer and the insulating pattern, wherein the light blocking pattern includes a first opening formed therethrough that corresponds to the light emitting element and a second opening formed therethrough that corresponds to the optical sensing element; and a color filter disposed on the insulating layer, the insulating pattern, and the light blocking pattern, and that overlaps the second opening, wherein the color filter that overlaps the insulating pattern protrudes further in a direction opposite to the insulating layer and the light blocking pattern than a color filter that does not overlap the insulating pattern with respect to the color filter.

14. The display device of claim 13, wherein a length (S1) of an effective fingerprint area is determined by the following Equation 1 of $$S1 = P + \frac{L1}{L2}(P + S2)$$

in a reference direction, wherein

P denotes a length of the second opening in the reference direction,

S2 denotes a length of a sensing area of the optical sensing element in the reference direction, L1 denotes a distance between an upper surface of the insulating pattern and an upper surface of the window in a thickness direction of the display device, and L2 denotes a distance between the upper surface of the insulating pattern and the optical sensing element in the thickness direction of the display device.

15. The display device of claim 14, wherein the length (S1) of the effective fingerprint area is equal to or less than about 500 micrometers.

16. The display device of claim 13, wherein the insulating pattern has a thickness greater than a thickness of the insulating layer.

17. The display device of claim 13, wherein the light emitting element is disposed inside the first opening when viewed in a plan view, and the second opening is disposed inside the optical sensing element.

18. The display device of claim 13, further comprising:

at least one inorganic layer disposed between the thin film encapsulation layer and the insulating layer; and an input sensing electrode disposed between the thin film encapsulation layer and the insulating layer.

* * * * *